(12) United States Patent  (10) Patent No.: US 12,057,315 B2
Kuo et al.  (45) Date of Patent: Aug. 6, 2024

(54) PHOTORESIST LAYER SURFACE TREATMENT, CAP LAYER, AND METHOD OF FORMING PHOTORESIST PATTERN

(71) Applicant: TAIWAN SEMICONDUCTOR MANUFACTURING COMPANY, LTD., Hsinchu (TW)

(72) Inventors: Yi-Chen Kuo, Taichung (TW); Chih-Cheng Liu, Hsinchu (TW); Ming-Hui Weng, New Taipei (TW); Jia-Lin Wei, Hsinchu (TW); Yen-Yu Chen, Taipei (TW); Jr-Hung Li, Chupei (TW); Yahru Cheng, Taipei (TW); Chi-Ming Yang, Hsinchu (TW); Tze-Liang Lee, Hsinchu (TW); Ching-Yu Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/204,259

(22) Filed: May 31, 2023

(65) Prior Publication Data

US 2023/0326754 A1  Oct. 12, 2023

Related U.S. Application Data

(62) Division of application No. 17/150,403, filed on Jan. 15, 2021, now Pat. No. 11,705,332.

(Continued)

(51) Int. Cl.
*H01L 21/00* (2006.01)
*H01L 21/02* (2006.01)
*H01L 21/027* (2006.01)

(52) U.S. Cl.
CPC ...... *H01L 21/0275* (2013.01); *H01L 21/0228* (2013.01); *H01L 21/02362* (2013.01)

(58) Field of Classification Search
CPC ............. H01L 21/0273; H01L 21/0274; H01L 21/0275; H01L 21/0271; G03F 7/092; G03F 7/11
See application file for complete search history.

(56) References Cited

U.S. PATENT DOCUMENTS 5,716,882 A * 2/1998 Tseng ................... H10B 12/033
257/E21.648
5,750,312 A  5/1998 Chandross et al.
(Continued)

FOREIGN PATENT DOCUMENTS

JP  2004-241707 A  8/2004
JP  2006-276443 A  10/2006
(Continued)

OTHER PUBLICATIONS

Non-Final Office Action issued in U.S. Appl. No. 17/150,403, dated Sep. 12, 2022.
(Continued)

*Primary Examiner* — Reema Patel
(74) *Attorney, Agent, or Firm* — STUDEBAKER & BRACKETT PC

(57) ABSTRACT

A method of forming a pattern in a photoresist layer includes forming a photoresist layer over a substrate, and reducing moisture or oxygen absorption characteristics of the photoresist layer. The photoresist layer is selectively exposed to actinic radiation to form a latent pattern, and the latent pattern is developed by applying a developer to the selectively exposed photoresist layer to form a pattern.

20 Claims, 39 Drawing Sheets

Related U.S. Application Data

(60) Provisional application No. 63/026,695, filed on May 18, 2020, provisional application No. 63/002,297, filed on Mar. 30, 2020.

(56) References Cited

U.S. PATENT DOCUMENTS

| | | |
|---|---|---|
| 6,107,006 A | 8/2000 | Chang |
| 6,555,234 B1 * | 4/2003 | Piao .................. G03F 7/11 |
| | | 428/448 |
| 8,796,666 B1 | 8/2014 | Huang et al. |
| 9,093,530 B2 | 7/2015 | Huang et al. |
| 9,213,234 B2 | 12/2015 | Chang |
| 9,223,220 B2 | 12/2015 | Chang |
| 9,256,133 B2 | 2/2016 | Chang |
| 9,310,684 B2 | 4/2016 | Meyers et al. |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 10,663,864 B2 | 5/2020 | Nihashi et al. |
| 10,770,294 B2 | 9/2020 | O'Meara et al. |
| 2012/0088369 A1 | 4/2012 | Weidman et al. |
| 2020/0348594 A1 | 11/2020 | Koh et al. |
| 2021/0013034 A1 | 1/2021 | Wu et al. |
| 2021/0302833 A1 | 9/2021 | Weng et al. |

FOREIGN PATENT DOCUMENTS

| | | |
|---|---|---|
| KR | 10-2020-0000378 A | 1/2020 |
| TW | 201712445 A | 4/2017 |
| TW | 202006168 A | 2/2020 |
| WO | 2019/217749 A1 | 11/2019 |

OTHER PUBLICATIONS

Notice of Allowance issued in U.S. Appl. No. 17/150,403, dated Mar. 1, 2023.

* cited by examiner

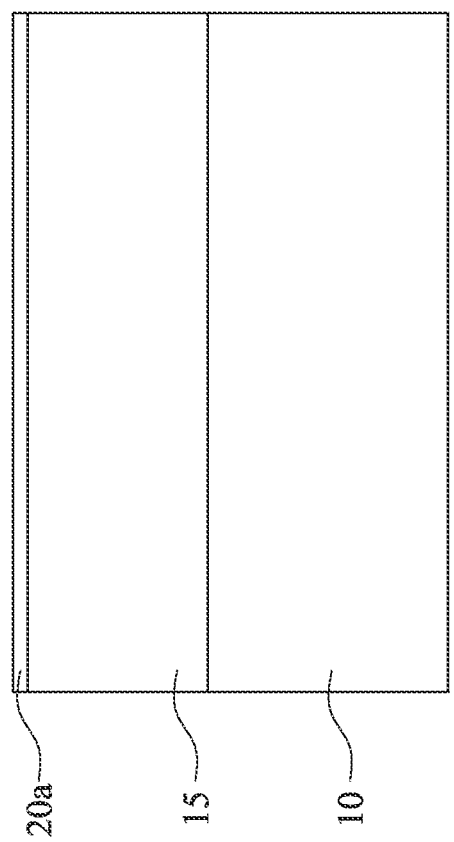

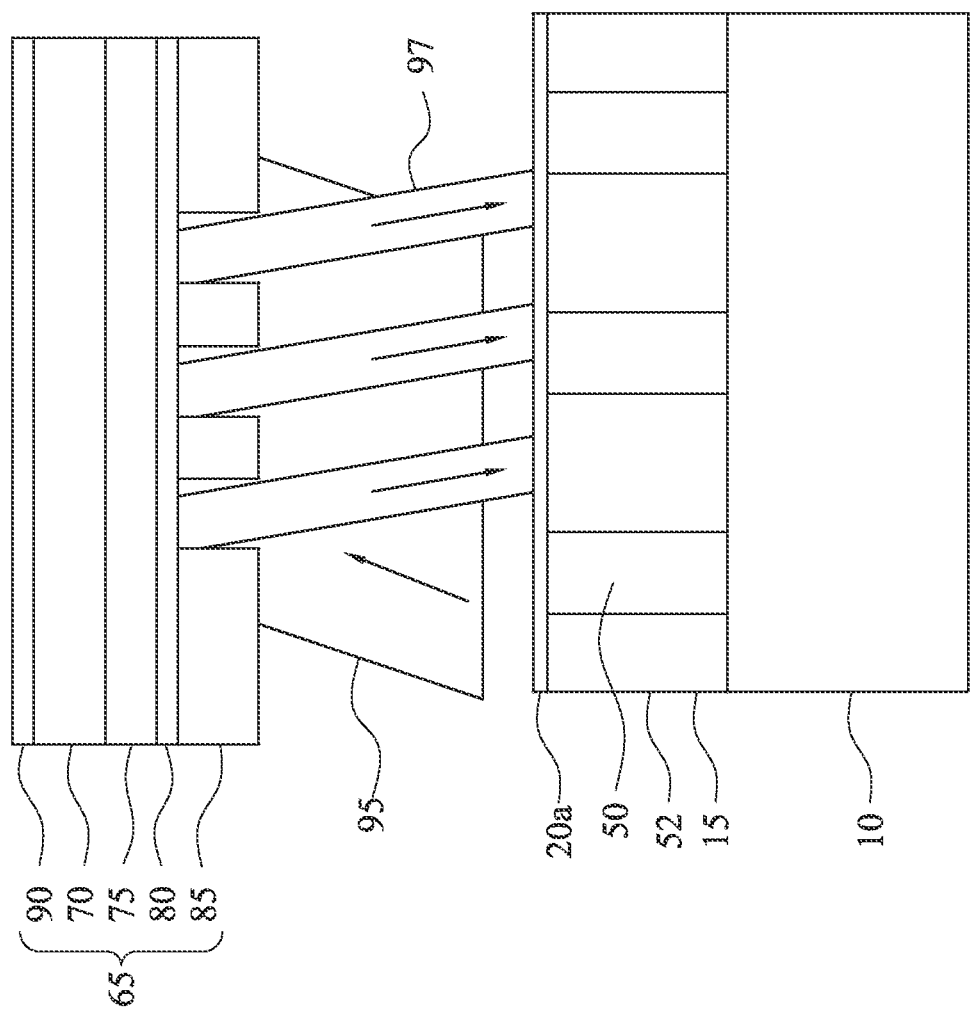

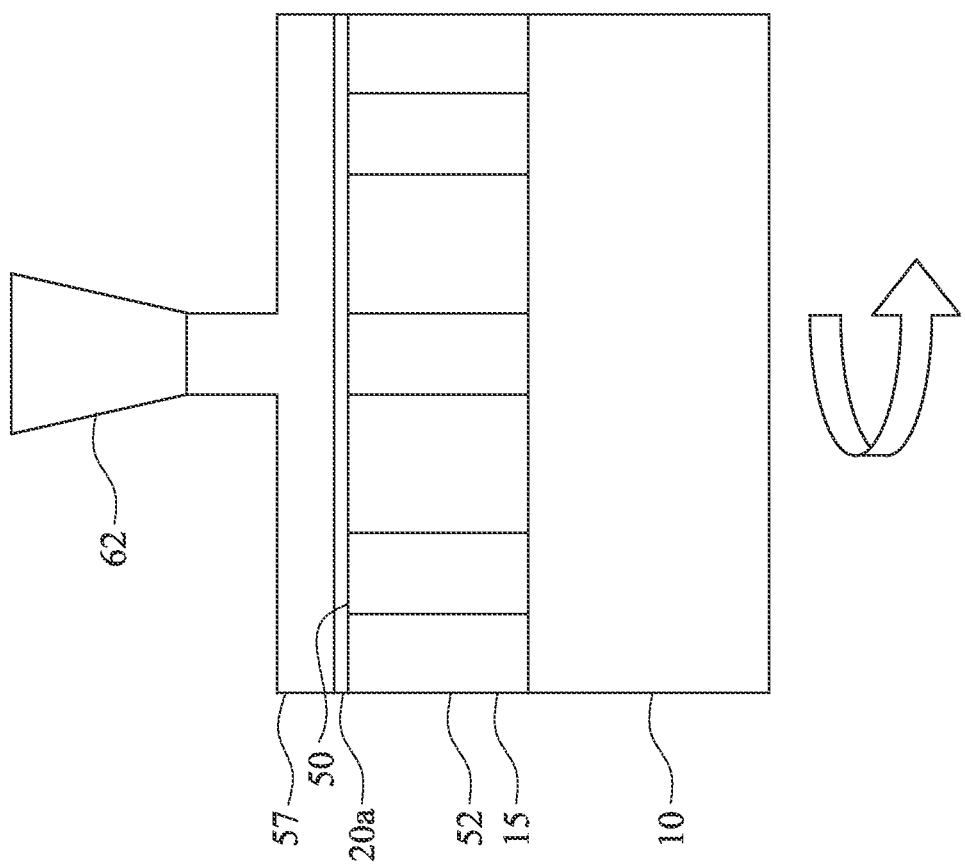

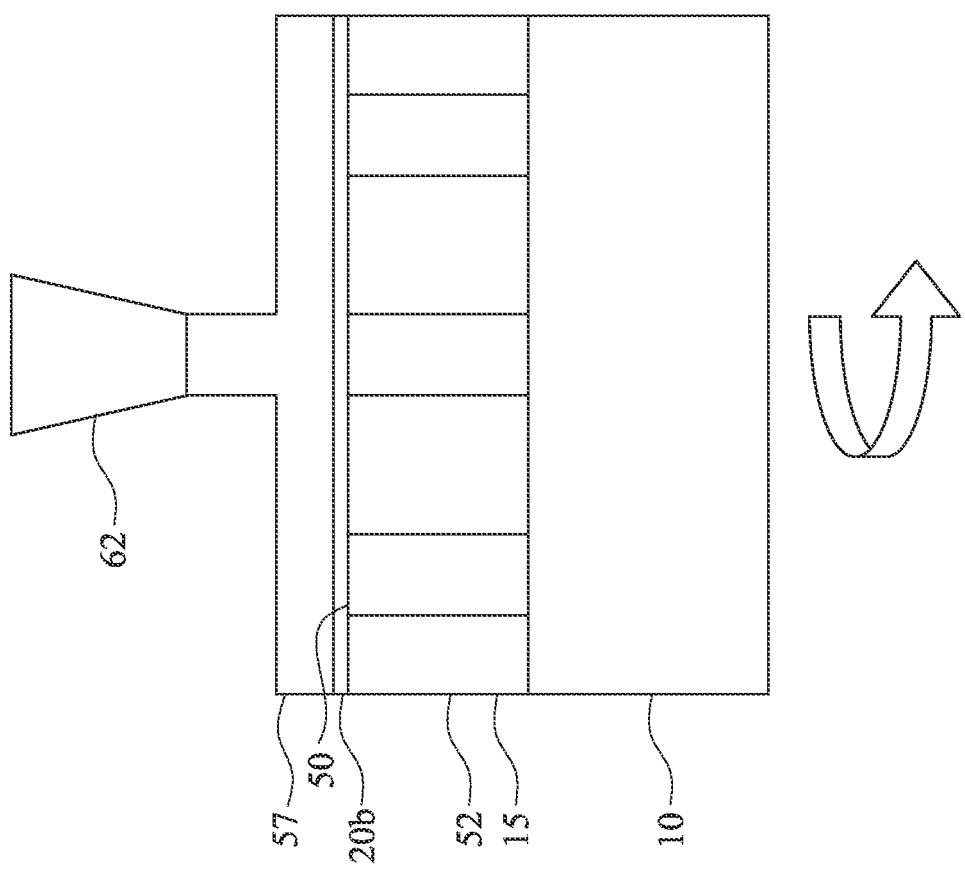

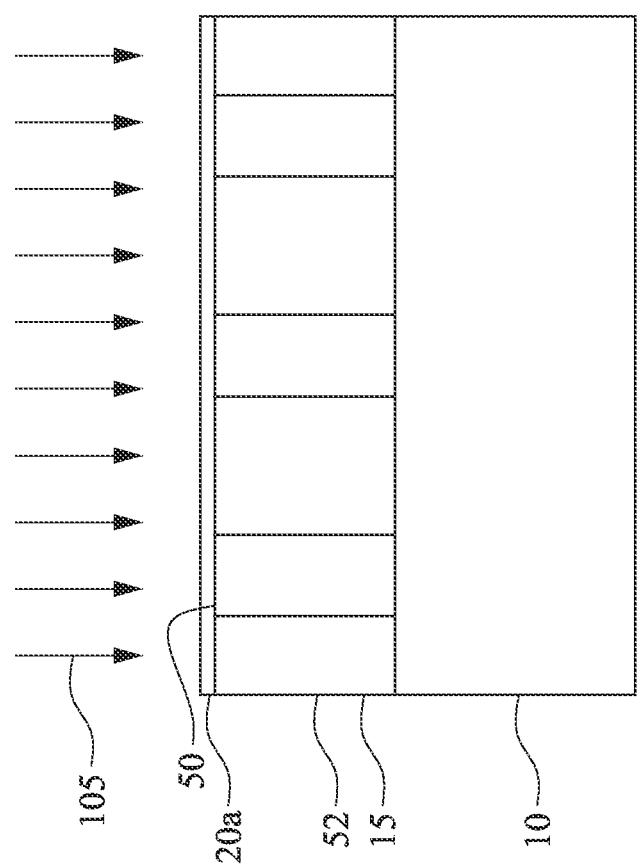

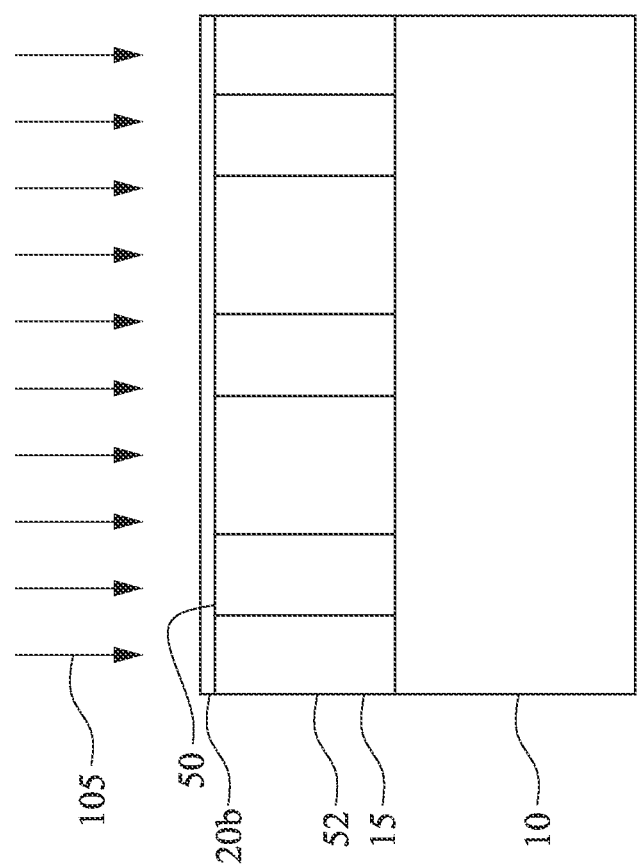

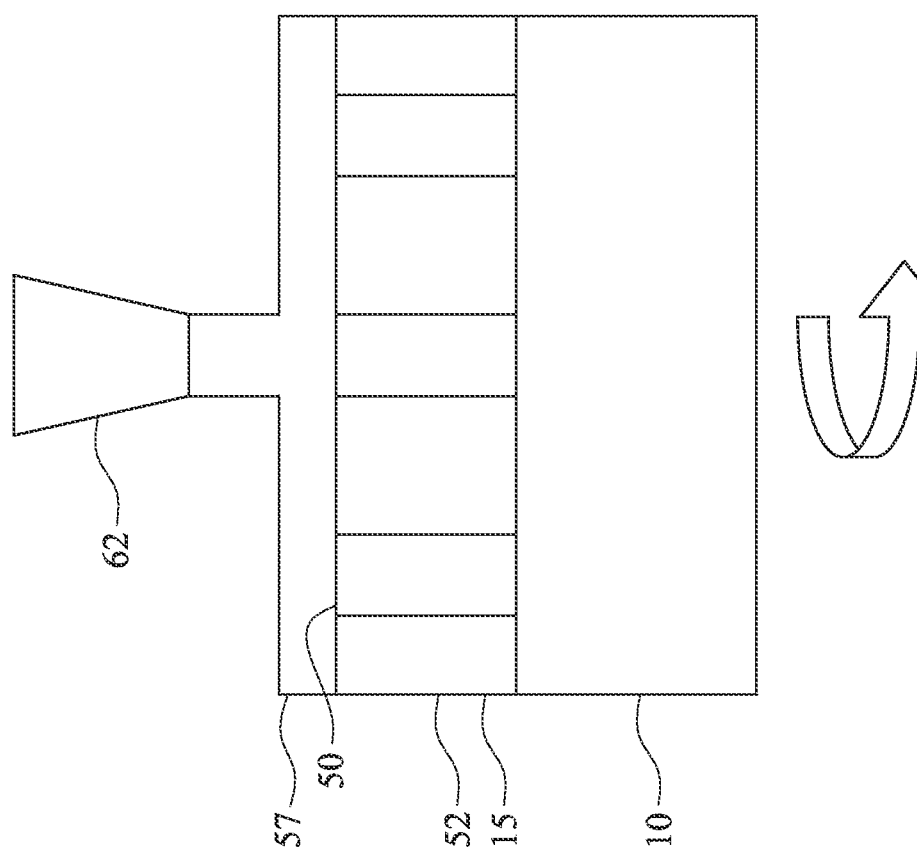

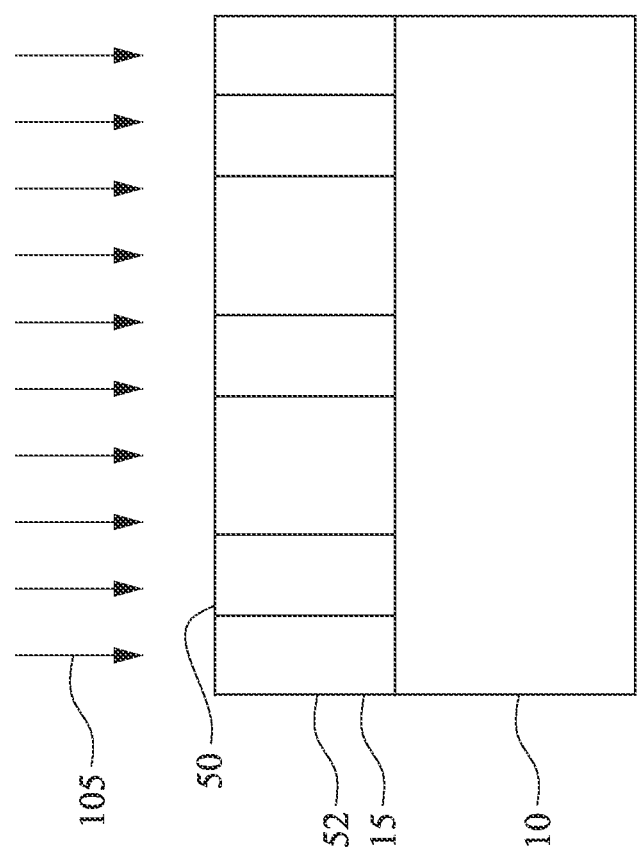

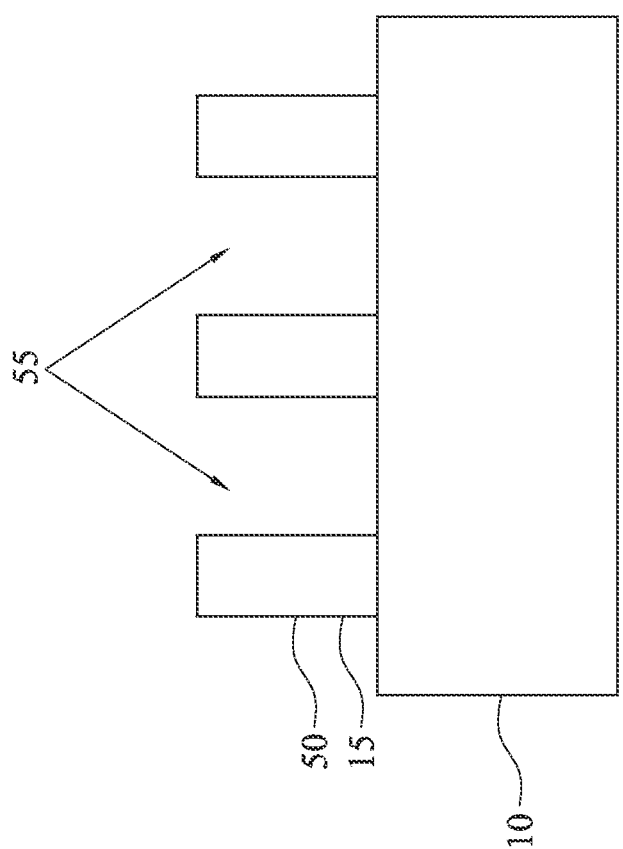

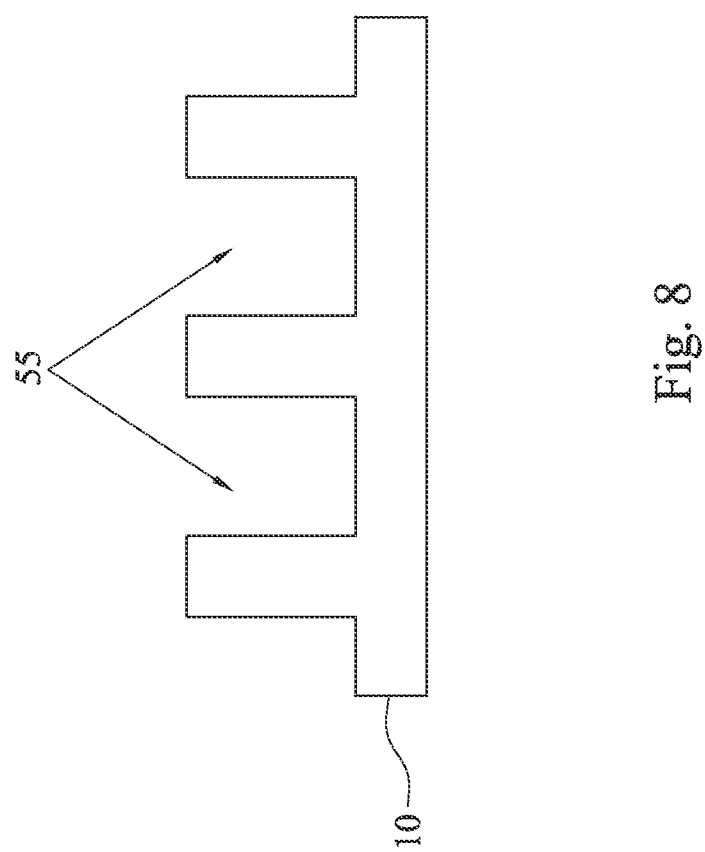

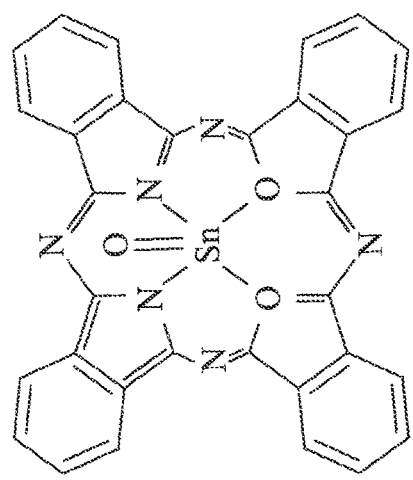
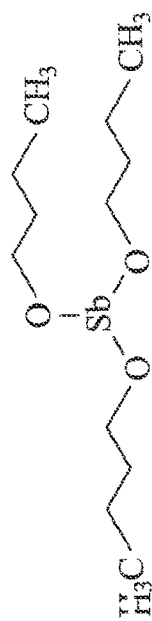
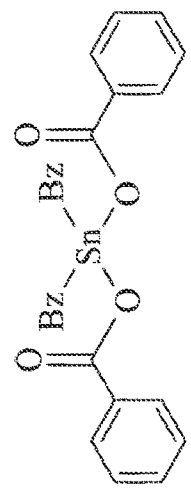
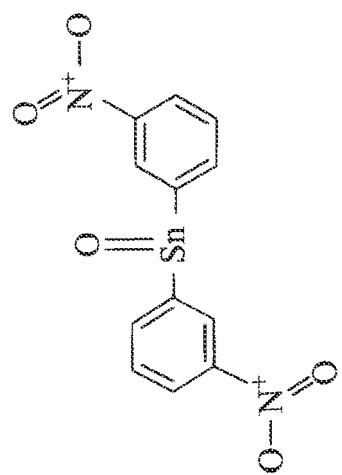
examples:
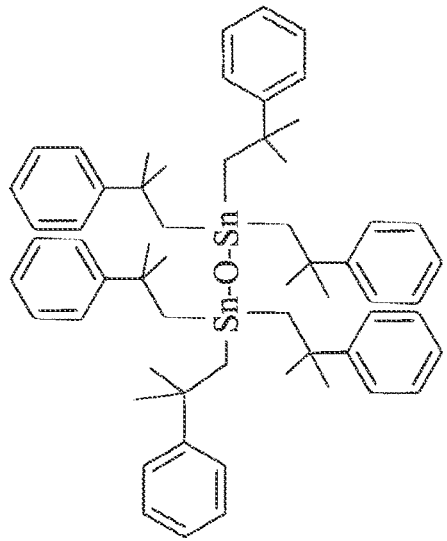
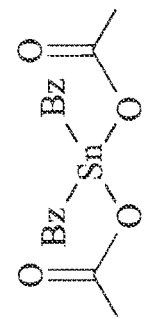
Fig. 9C

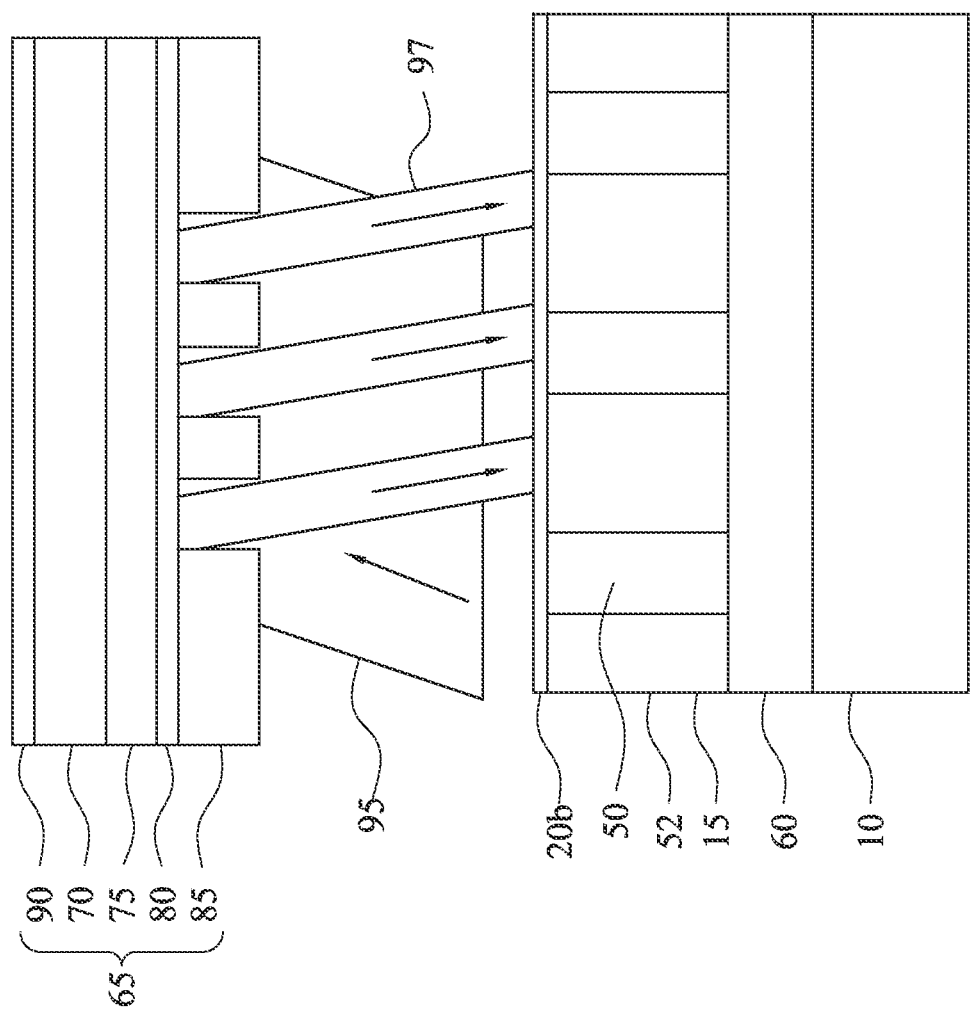

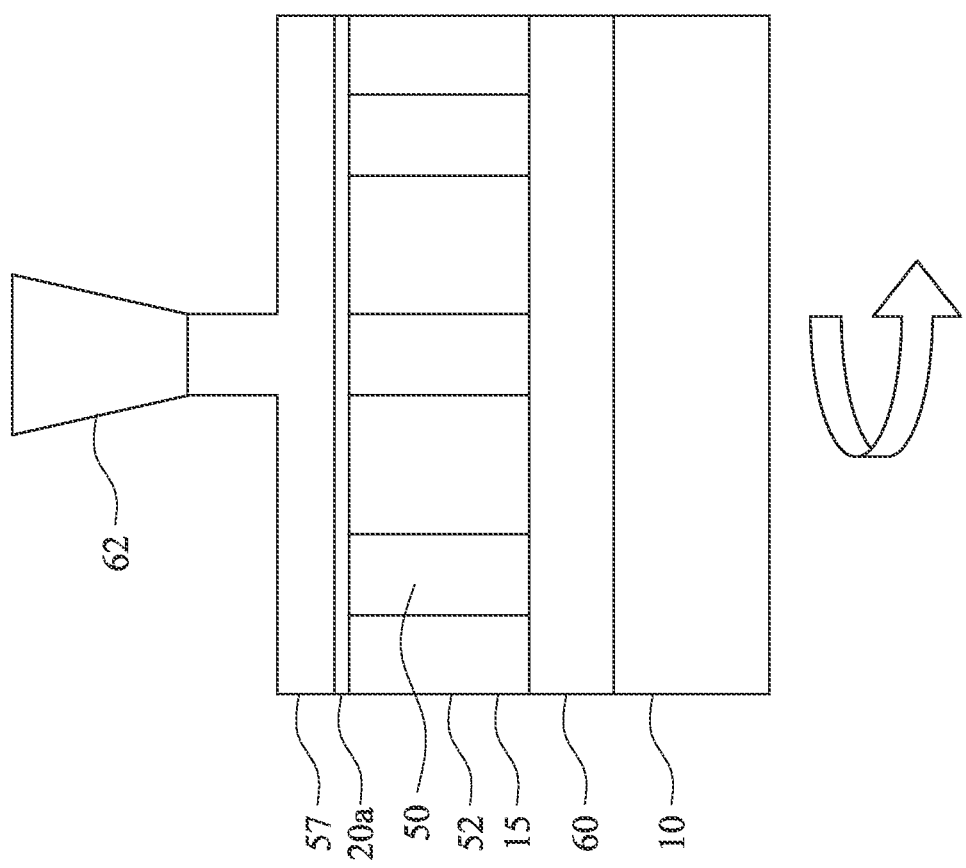

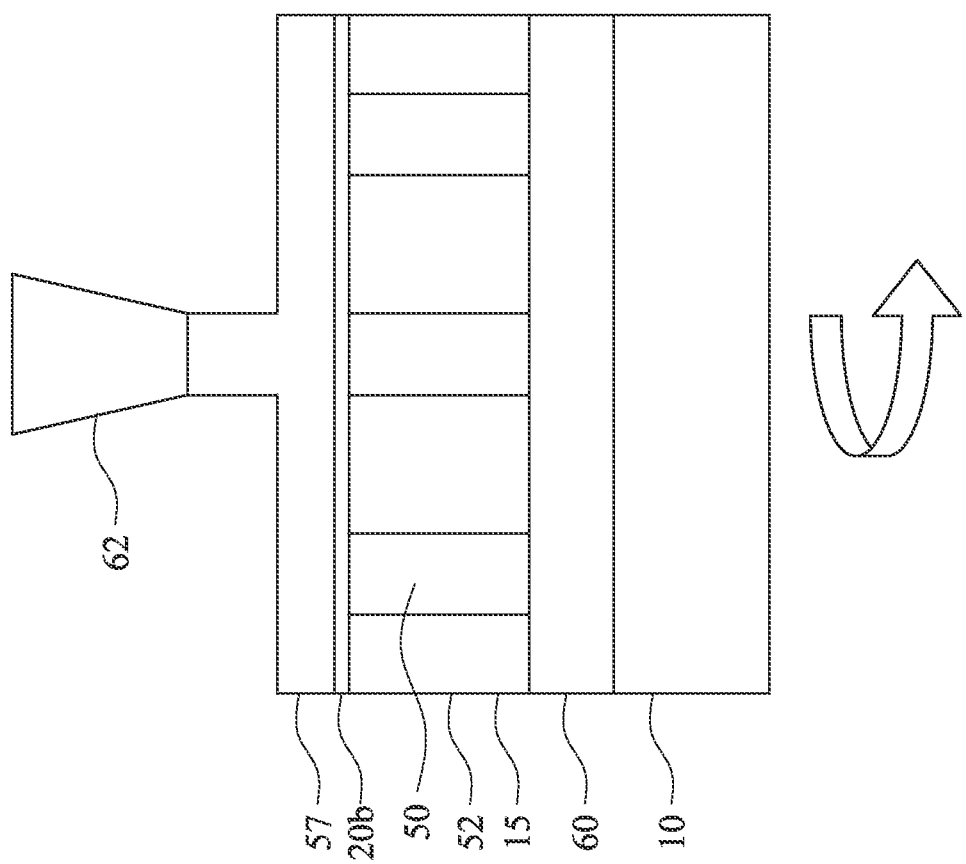

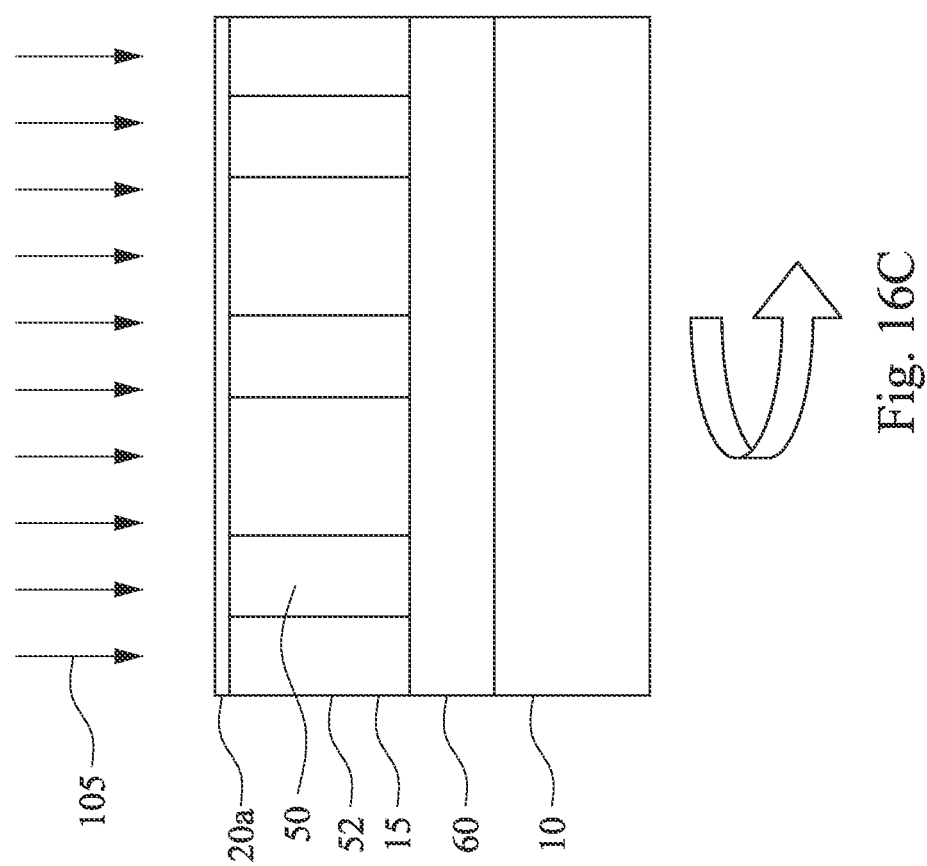

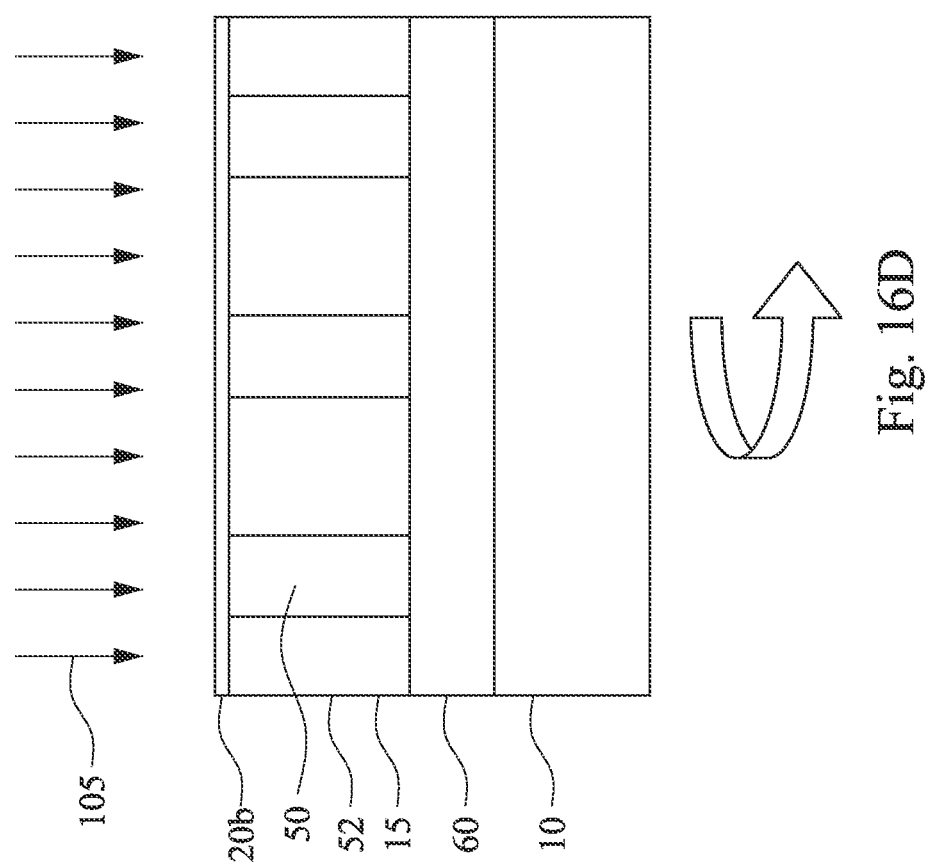

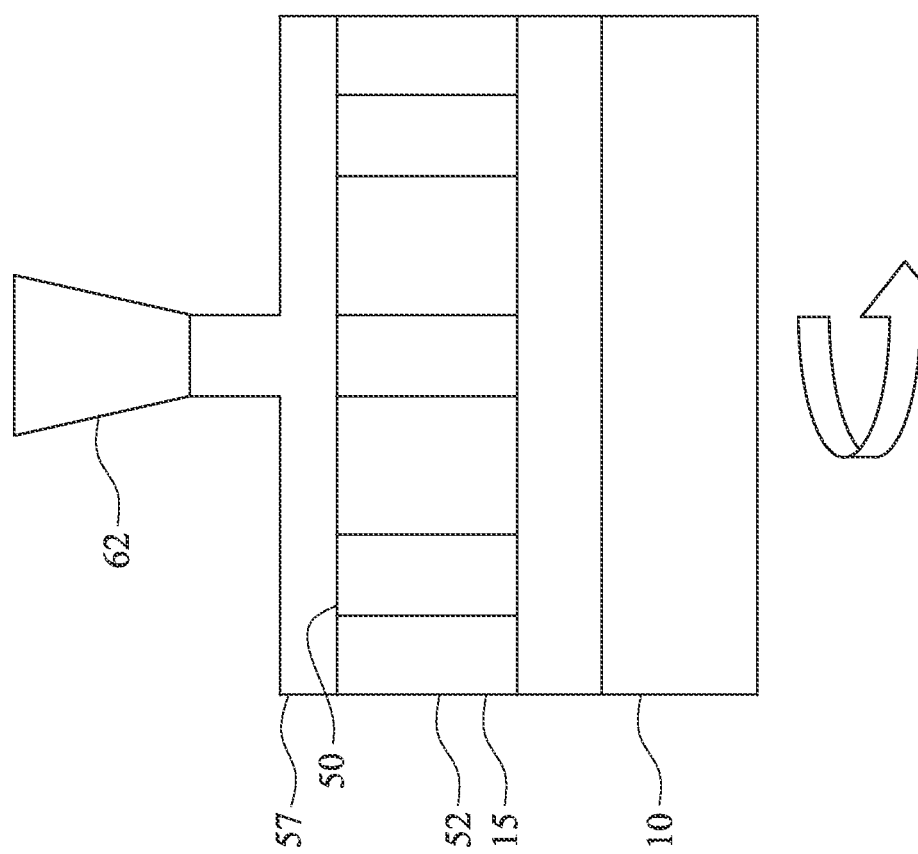

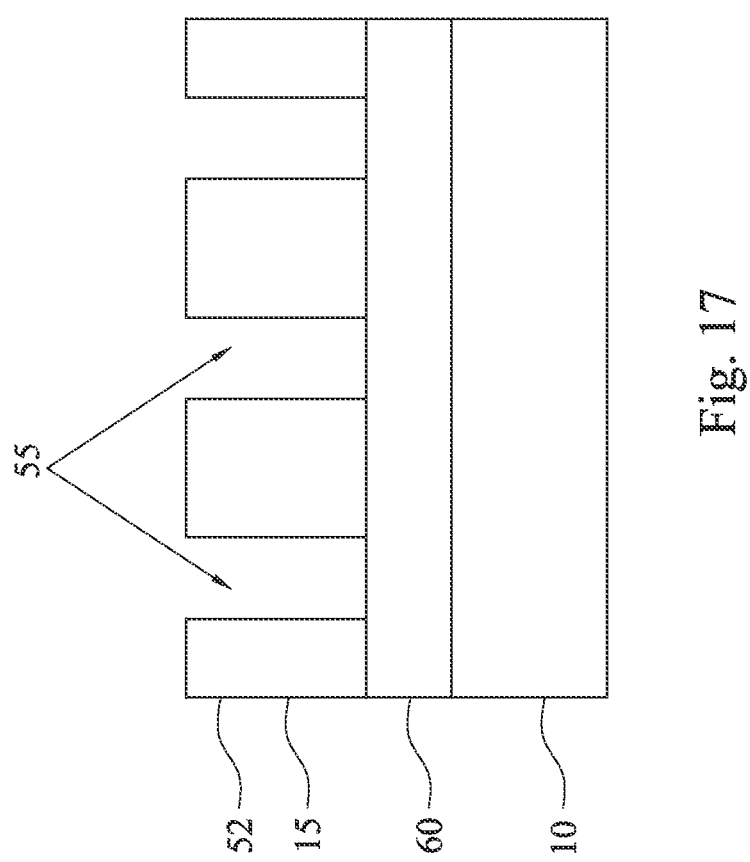

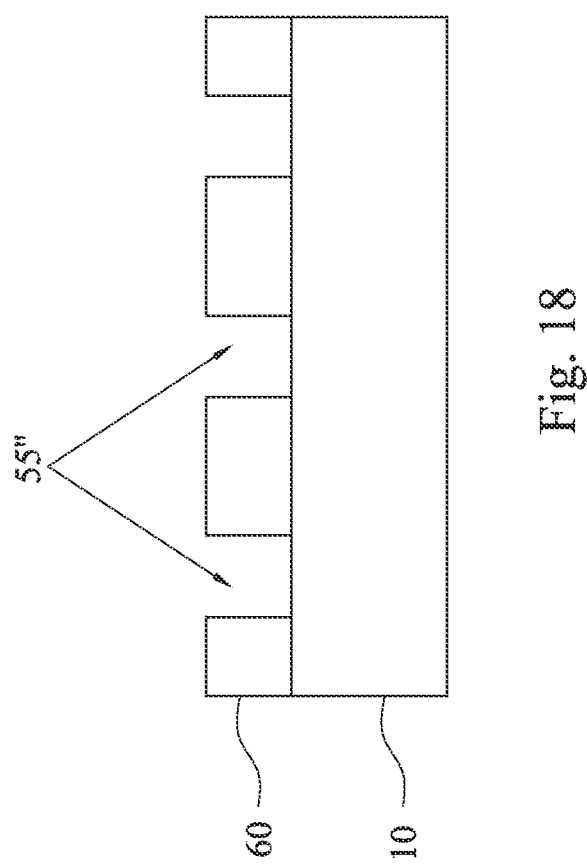

PHOTORESIST LAYER SURFACE TREATMENT, CAP LAYER, AND METHOD OF FORMING PHOTORESIST PATTERN

RELATED APPLICATIONS

This application is a divisional application of U.S. patent application Ser. No. 17/150,403, filed Jan. 15, 2021, now U.S. Pat. No. 11,705,332, which claims priority to U.S. Provisional Patent Application No. 63/002,297 filed Mar. 30, 2020, and U.S. Provisional Patent Application No. 63/026,695 filed May 18, 2020, the entire contents of each are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A and 4B show a process stage of a sequential operation according to embodiments of the disclosure.

FIGS. 5A, 5B, 5C, and 5D show a process stage of a sequential operation according to embodiments of the disclosure.

FIGS. 6A, 6B, 6C, 6D, 6E, and 6F show a process stage of a sequential operation according to embodiments of the disclosure.

FIG. 7 shows a process stage of a sequential operation according to an embodiment of the disclosure.

FIG. 8 shows a process stage of a sequential operation according to an embodiment of the disclosure.

FIGS. 9A, 9B, and 9C show organometallic precursors according to embodiments of the disclosure.

FIGS. 15A, 15B, 15C, and 15D show a process stage of a sequential operation according to embodiments of the disclosure.

FIGS. 16A, 16B, 16C, 16D, 16E, and 16F show a process stage of a sequential operation according to embodiments of the disclosure.

FIG. 17 shows a process stage of a sequential operation according to an embodiment of the disclosure.

FIG. 18 shows a process stage of a sequential operation according to an embodiment of the disclosure.

DETAILED DESCRIPTION

Figure 1:
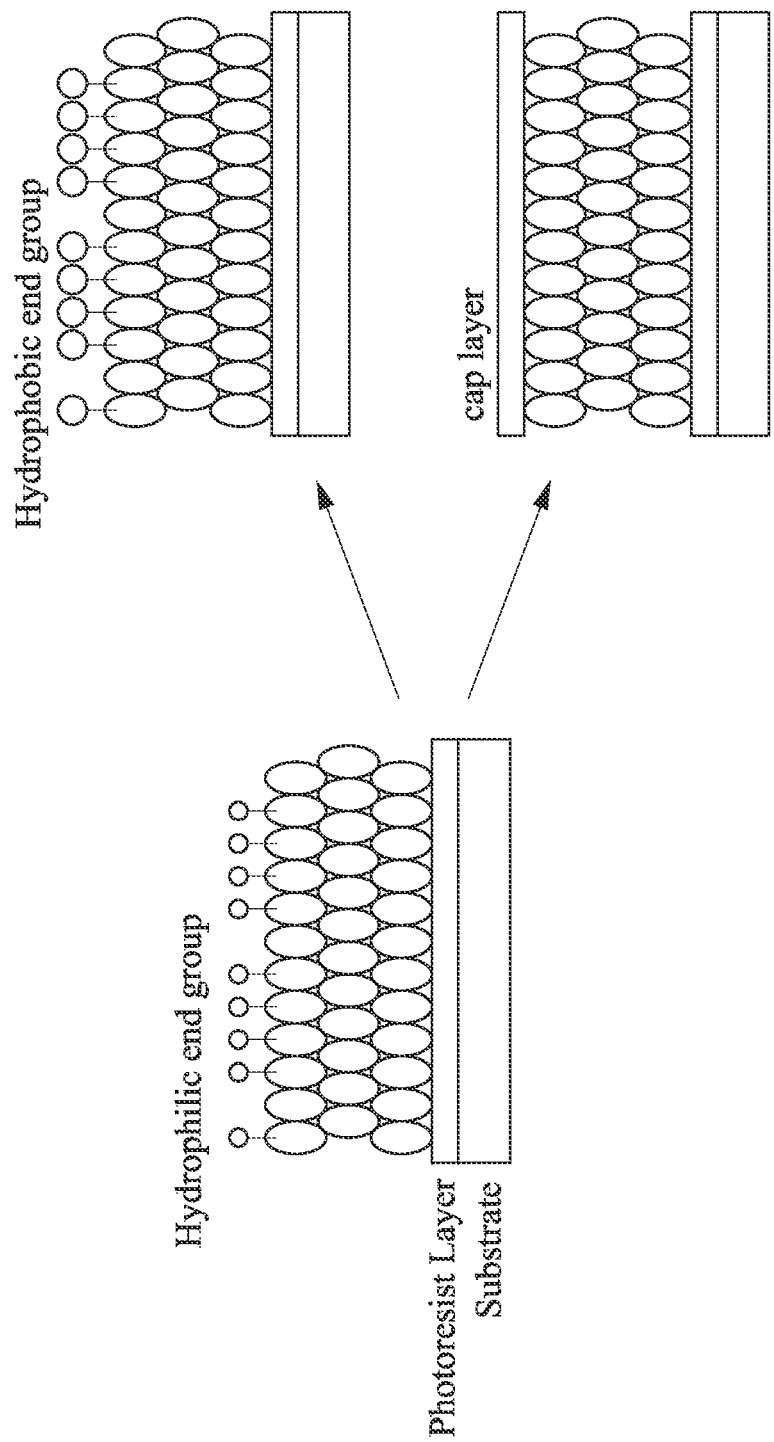
FIG. 1 shows a process stage of a sequential operation according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL, an increase in wafer exposure throughput is desirable. Wafer exposure throughput can be improved through increased exposure power or increased resist photospeed (sensitivity).

Metal-containing photoresists are used in extreme ultraviolet lithography because metals have a high absorption capacity of EUV radiation. Metal-containing photoresists, however, absorb ambient moisture and oxygen, which can degrade the pattern resolution. The absorption of moisture and oxygen may initiate the crosslinking reaction in the photoresist layer thereby decreasing the solubility of the non-exposed regions in the photoresist to the photoresist developer. In addition, volatile precursors in the photoresist layer may outgas prior to the radiation exposure and development operations, which would cause the photoresist layer quality to change over time, and may cause contamination to the semiconductor device processing chamber, handling equipment, and other semiconductor wafers. The photoresist layer moisture and oxygen absorption and photoresist outgassing negatively affects the lithography performance and increases defects.

To prevent moisture and oxygen absorption and photoresist outgassing, embodiments of the disclosure treat the surface of the photoresist layer or form a cap layer over the photoresist layer, as shown in FIG. 1. Surface treatment operations according to the present disclosure include modifying ligands in the metal-containing photoresist to convert hydrophilic end groups on the surface of the ligands in the photoresist layer to hydrophobic end groups.

In some embodiments, hydrophilic ligand end groups at the upper surface of the photo resist layer are replaced with hydrophobic end groups. In some embodiments, the photoresist layer is treated with a plasma or undergoes a thermal treatment to change the hydrophilic ligand end groups to hydrophobic end groups.

In other embodiments, a cap layer is deposited on the photoresist layer, as shown in FIG. 1. In some embodiments, the cap layer is a monolayer. In some embodiments, the cap layer is a dielectric layer.

The surface treatment and cap layer protect the photoresist layer from exposure to ambient moisture and oxygen, and inhibits outgas sing, thereby stabilizing the photoresist layer and reducing defects. The surface treatment and cap layer improve developer dispersion on the photoresist surface thereby reducing scum and bridge defects.

Figure 2A:
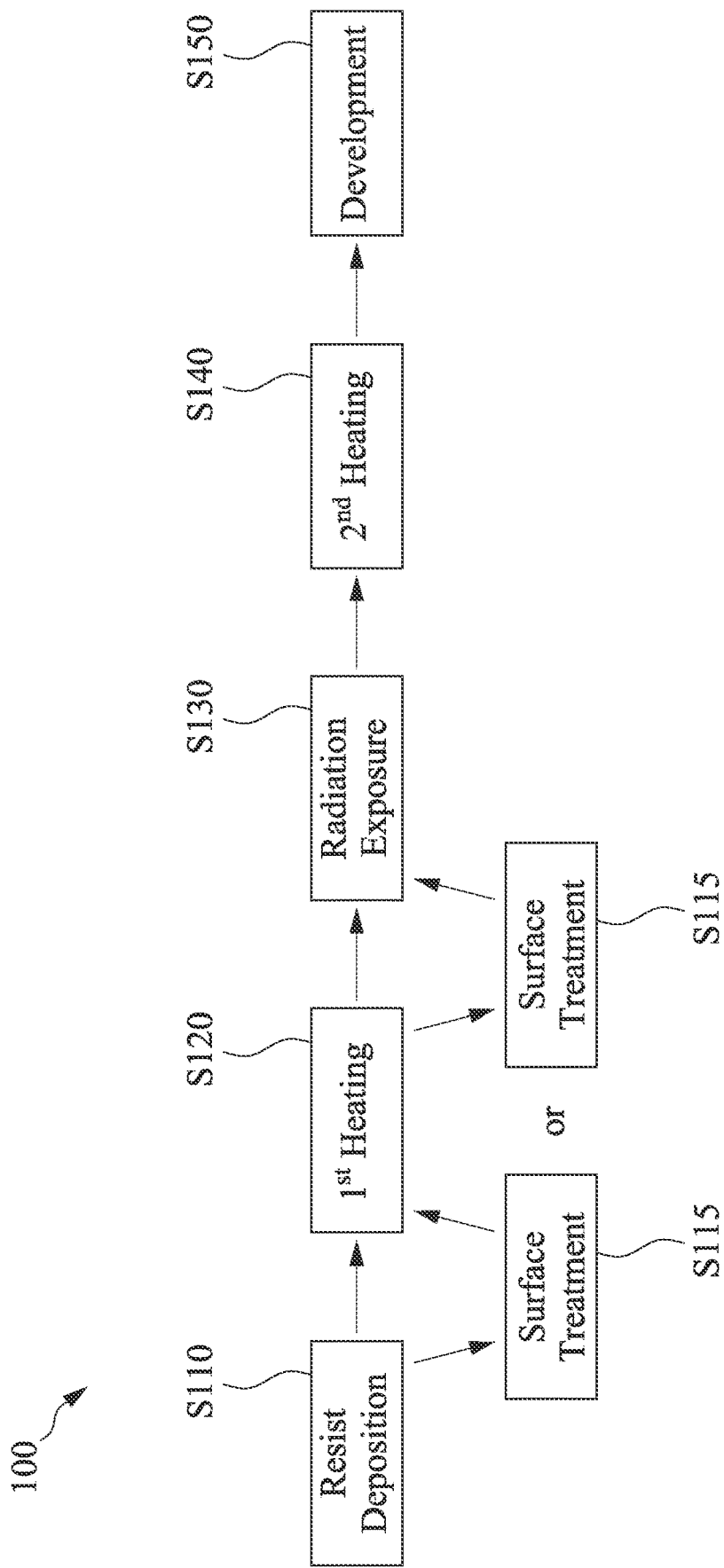
FIGS. 2A and 2B illustrate process flows of manufacturing a semiconductor device according to embodiments of the disclosure.
Figure 2B:
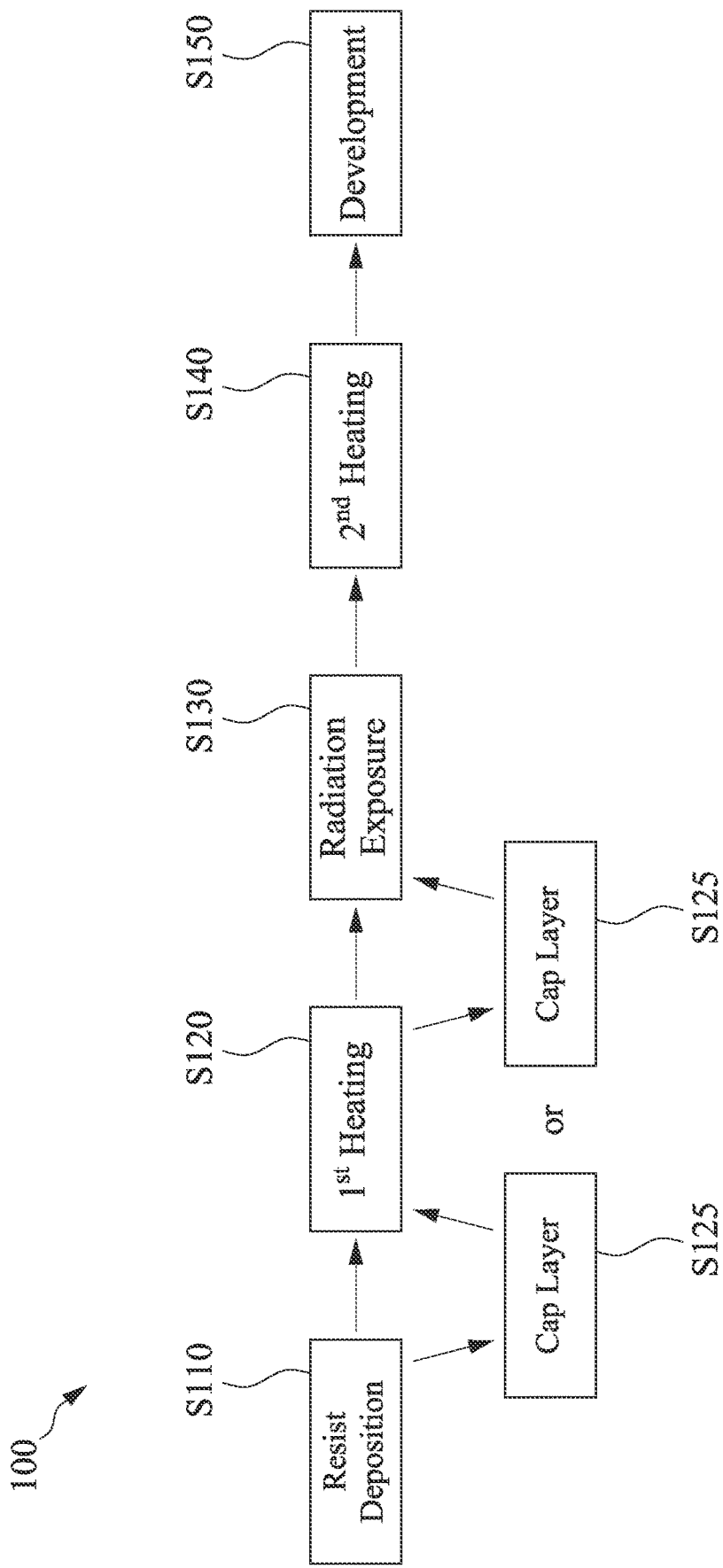
Figure 3:
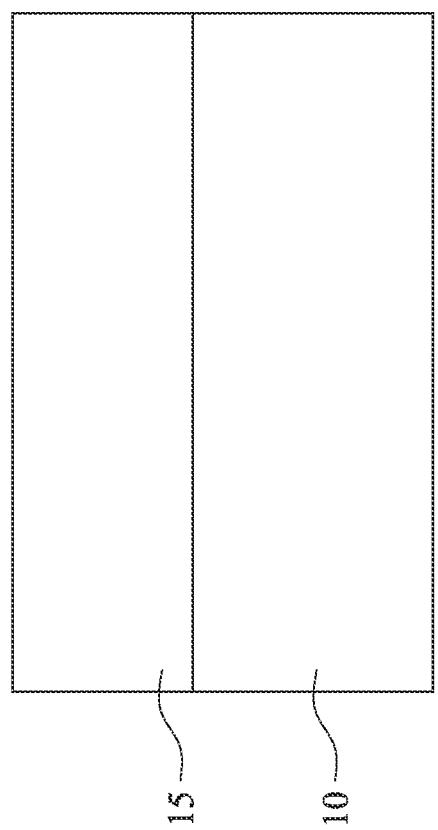
FIG. 3 shows a process stage of a sequential operation according to an embodiment of the disclosure.

FIGS. 2A and 2B illustrate process flows 100 of manufacturing a semiconductor device according to embodiments of the disclosure. A resist is coated on a surface of a layer to be patterned or a substrate 10 in operation S110, in some embodiments, to form a resist layer 15, as shown in FIG. 3. In some embodiments, the resist is a metal-containing photoresist formed by chemical vapor deposition (CVD) or atomic layer deposition (ALD). In other embodiments, the metal-containing photoresist layer is formed by a spin-coating method. In some embodiments, a surface treatment S115 is performed on the resist layer 15 to form a surface treated layer 20a, as shown in FIGS. 2A and 4A. The surface treatment S115 changes the surface of the resist layer 15 from a hydrophilic surface to a hydrophobic surface.

In some embodiments, the resist layer 15 undergoes a first heating operation S120 after the surface treatment operation S115. In some embodiments, the first heating operation S120 includes heating the resist layer 15 at a temperature of between about 40° C. and about 150° C. for about 10 seconds to about 10 minutes during the first heating operation S120. In some embodiments, the resist layer 15 undergoes the first heating operation S120 before the surface treatment S115 is performed on the resist layer 15.

Figure 4B:
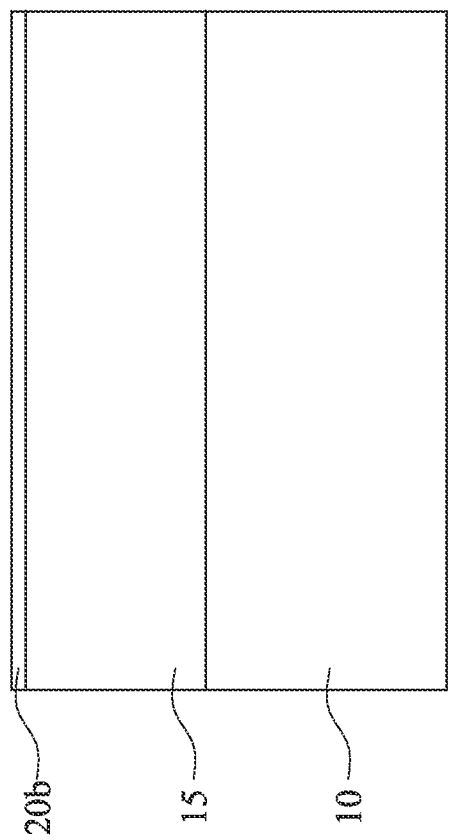

In some embodiments, as shown in FIGS. 2B and 4B, a cap layer 20b is formed in operation S125 over the resist layer 15. In some embodiments, the cap layer 20b is formed before a first heating operation S120. In other embodiments, the cap layer formation operation S125 is performed after the first heating operation S120. In some embodiments, the resist layer 15 is heated at a temperature of between about 40° C. and about 150° C. for about 10 seconds to about 10 minutes during the first heating operation S120.

The resist layer 15 and the surface treated layer 20a or the resist layer 15 and the cap layer 20b are subsequently selectively exposed to actinic radiation 45/97 (see FIGS. 5A, 5B, 5C, and 5D) in operation S130 of FIGS. 2A and 2B. The resist layer 15 is exposed to actinic radiation 45/97 through the surface treated layer 20a or cap layer 20b. In some embodiments, the actinic radiation 45/97 is not substantially absorbed by the surface treated layer 20a or cap layer 20b. In some embodiments, the photoresist layer 15 is selectively or patternwise exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the resist layer 15 is selectively or patternwise exposed to an electron beam. In some embodiments, the resist layer 15 is a photoresist layer that is photosensitive to the actinic radiation 45/97 and the cap layer 20b is not a photoresist layer and is not photosensitive to the actinic radiation 45/97.

Photoresist layers according to the present disclosure are layers that undergo a chemical reaction upon absorption of the actinic radiation causing portions of the photoresist layer that are exposed to the actinic radiation to change solubility in a developer in contrast to portions of the photoresist layer that are not exposed to the actinic radiation. The layers that are not photosensitive to the actinic radiation do not substantially undergo a chemical reaction to change the layer's solubility in a developer upon exposure to the actinic radiation.

Figure 5A:
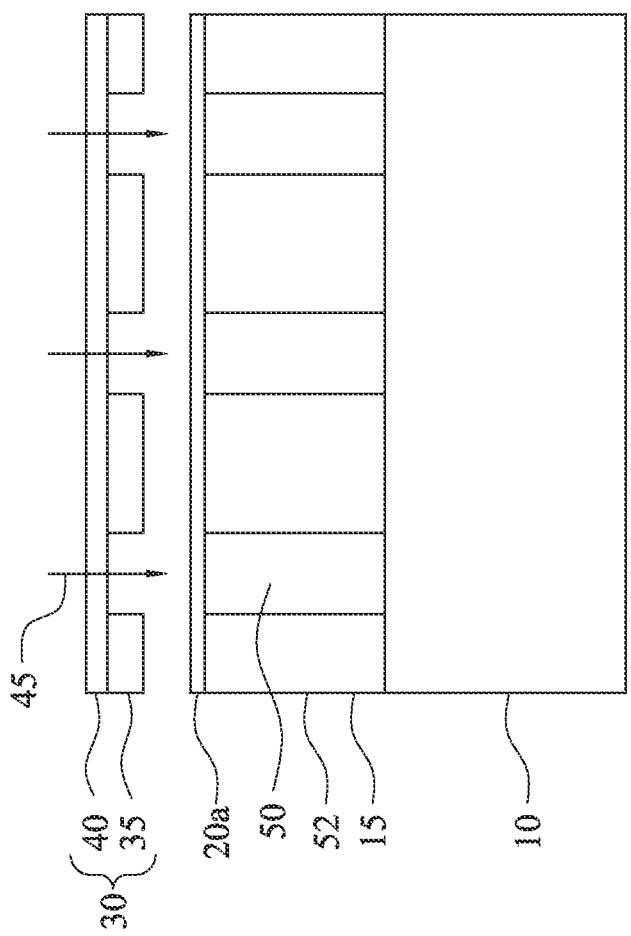
Figure 5B:
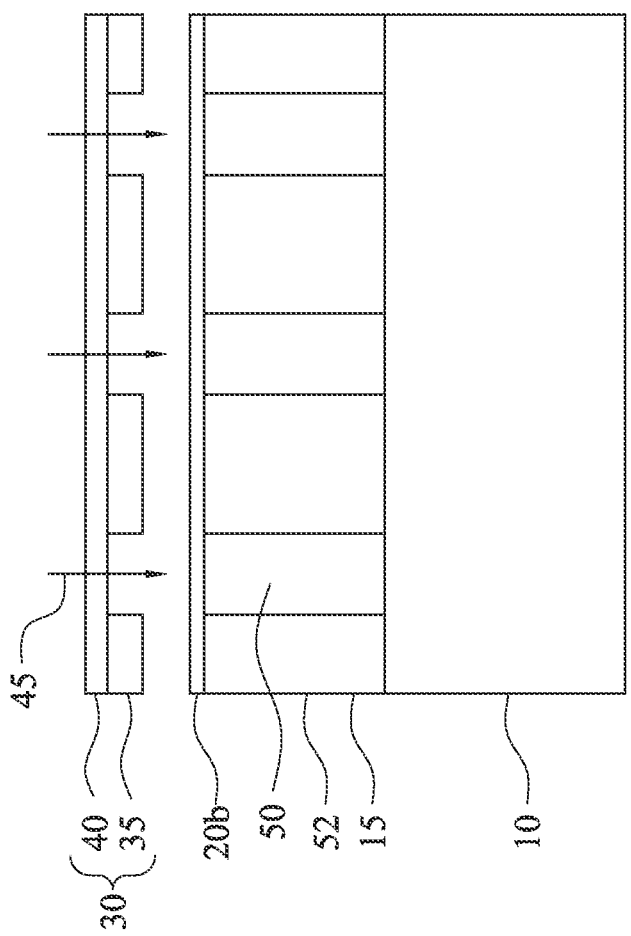

As shown in FIGS. 5A and 5B, the exposure radiation 45 passes through a photomask 30 before irradiating the photoresist layer 15 in some embodiments. In some embodiments, the photomask 30 has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 5D:
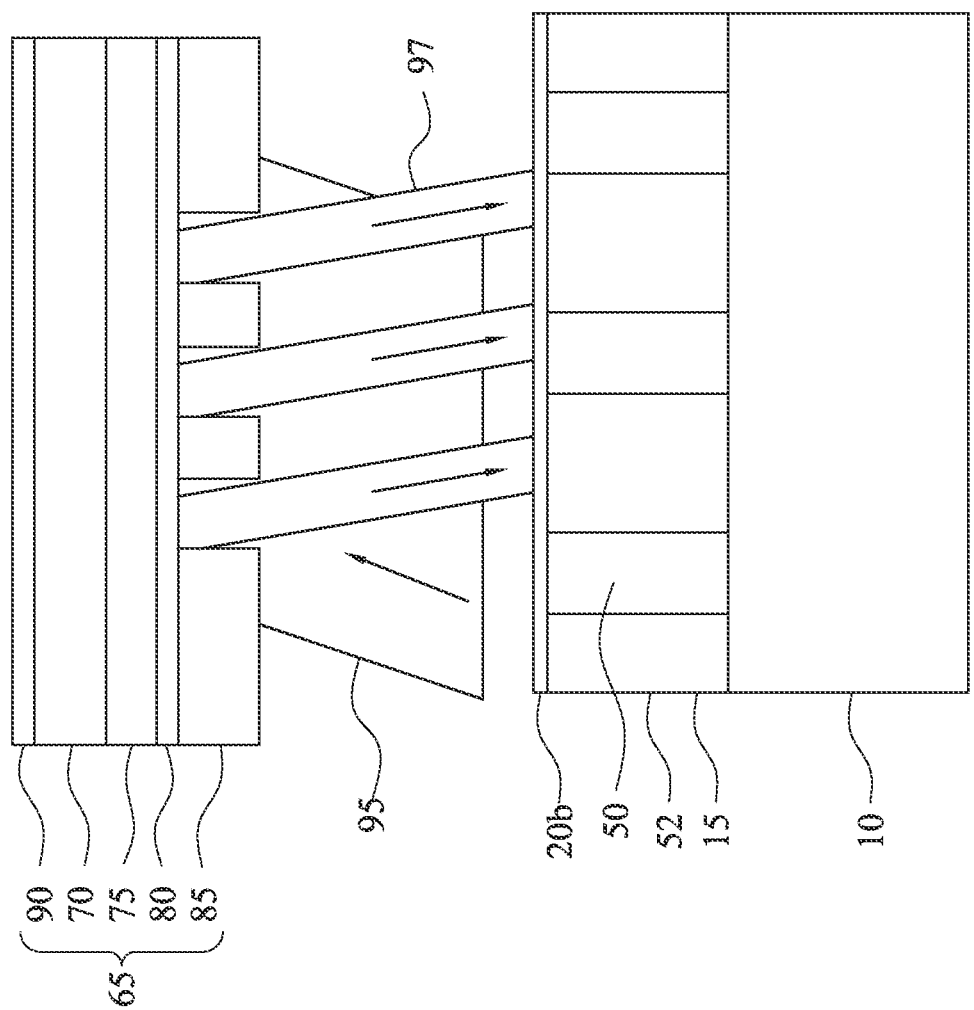

In some embodiments, the selective or patternwise exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIGS. 5C and 5D. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. Extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are located between the reflective photomask 65 and the photoresist-coated substrate 10.

In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

The amount of electromagnetic radiation can be characterized by a fluence or dose, which is obtained by the integrated radiative flux over the exposure time. Suitable radiation fluences range from about 1 $mJ/cm^2$ to about 150 $mJ/cm^2$ in some embodiments, from about 2 $mJ/cm^2$ to about 100 $mJ/cm^2$ in other embodiments, and from about 3 $mJ/cm^2$ to about 50 $mJ/cm^2$ in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 $\mu C/cm^2$ to about 5 $\mu C/cm^2$ in some embodiments, from about 0.5 $\mu C/cm^2$ to about 1 $\mu C/cm^2$ in other embodiments, and in other embodiments from about 1 $\mu C/cm^2$ to about 100 $\mu C/cm^2$. A person of ordinary skill in the art can compute corresponding doses at other beam energies based on the teachings herein and will recognize that additional ranges of electron beam properties within the explicit ranges above are contemplated and are within the present disclosure.

In some embodiments, the exposure of the resist layer 15 uses an immersion lithography technique. In such a technique, an immersion medium (not shown) is placed between the final optics and the photoresist layer, and the exposure radiation 45 passes through the immersion medium.

The region of the resist layer exposed to radiation 50 undergoes a chemical reaction thereby changing its susceptibility to being removed in a subsequent development operation S150. In some embodiments, the portion of the resist layer exposed to radiation 50 undergoes a reaction making the exposed portion more easily removed during the development operation S150. In other embodiments, the portion of the resist layer exposed to radiation 50 undergoes a reaction making the exposed portion resistant to removal during the development operation S150.

Next, the resist layer 15 undergoes a second heating or a post-exposure bake (PEB) in operation S140. In some embodiments, the resist layer 15 is heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S140 causes the reaction product of a first compound or first precursor and a second compound or second precursor in the resist layer to crosslink.

The selectively exposed resist layer 15 is subsequently developed in operation S150. In some embodiments, the resist layer 15 is developed by applying a solvent-based developer 57 to the selectively exposed resist layer. As shown in FIGS. 6A and 6B, a liquid developer 57 is supplied from a dispenser 62 to the resist layer 15 and the surface treated layer 20*a* or the resist layer 15 and the cap layer 20*b*, respectively. In some embodiments, the exposed portions 50 of the photoresist layer undergo a crosslinking reaction as a result of the exposure to actinic radiation or the post-exposure bake, and the unexposed portion 52 of the photoresist layer is removed by the developer 57 forming a pattern of openings 55 in the photoresist layer 15 to expose the substrate 10, as shown in FIG. 7. In some embodiments, the surface treated layer 20*a* and cap layer 20*b* are removed during the development operation.

In some embodiments, the resist developer 57 includes a solvent, and an acid or a base. In some embodiments, the concentration of the solvent is from about 60 wt. % to about 99 wt. % based on the total weight of the resist developer. The acid or base concentration is from about 0.001 wt. % to about 20 wt. % based on the total weight of the resist developer. In certain embodiments, the acid or base concentration in the developer is from about 0.01 wt. % to about 15 wt. % based on the total weight of the resist developer.

In some embodiments, the developer 57 is applied to the resist layer 15 using a spin-on process. In the spin-on process, the developer 57 is applied to the resist layer 15 from above the resist layer 15 while the resist-coated substrate is rotated, as shown in FIG. 6A. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

In some embodiments, the developer 57 is an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments, a dry developer 105 is applied to the selectively exposed resist layer 15 and the surface treated layer 20a or cap layer 20b, as shown in FIGS. 6C and 6D. In some embodiments, the dry developer 105 is a plasma or chemical vapor, and the dry development operation S150 is a plasma etching or chemical etching operation. The dry development uses the differences related to the composition, extent of cross-linking, and film density to selectively remove the desired portions of the resist. In some embodiments, the dry development processes uses either a gentle plasma (high pressure, low power) or a thermal process in a heated vacuum chamber while flowing a dry development chemistry, such as $BCl_3$, $BF_3$, or other Lewis Acid in the vapor state. In some embodiments, the $BCl_3$ removes the unexposed material, leaving behind a pattern of the exposed film that is transferred into the underlying layers by plasma-based etch processes.

In some embodiments, the dry development includes plasma processes, including transformer coupled plasma (TCP), inductively coupled plasma (ICP) or capacitively coupled plasma (CCP). In some embodiments, the plasma process is conducted at a pressure of ranging from about 5 mTorr to a pressure of about 20 mTorr, at a power level from about 250 W to about 1000 W, temperature ranging from about 0° C. to about 300° C., and at flow rate of about 100 to about 1000 sccm, for about 1 to about 3000 seconds.

In some embodiments, the surface treated layer 20a or cap layer 20b is removed after the post exposure bake operation S140 and before the development operation S150; and then subsequently developed by either a wet development operation, as shown in FIG. 6E or dry development operation, as shown in FIG. 6F. In some embodiments, the surface treated layer 20a or cap layer 20b is removed by a suitable solvent or by a suitable dry etchant.

The development operation S150 provides a pattern 55 in the photoresist layer exposing portions of the substrate 10, as shown in FIG. 7. After the development operation, additional processing is performed while the patterned photoresist layer 15, 50 is in place. For example, an etching operation, using dry or wet etching, is performed in some embodiments, to transfer the pattern of the resist layer 15, 50 to the underlying substrate 10, forming recesses 55' as shown in FIG. 8. The substrate 10 has a different etch resistance than the resist layer 15. In some embodiments, the etchant is more selective to the substrate 10 than the resist layer 15. In some embodiments, the patterned resist layer 15, 50 is at least partially removed during the etching operation in some embodiments. In other embodiments, the patterned resist layer 15, 50 is removed after etching the substrate 10 by selective etching, using a suitable resist stripper solvent, or by a resist plasma ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal-nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

In some embodiments, the photoresist layer includes a high sensitivity photoresist composition. In some embodiments, the high sensitivity photoresist composition is highly sensitive to extreme ultraviolet (EUV) radiation.

Figure 9A:
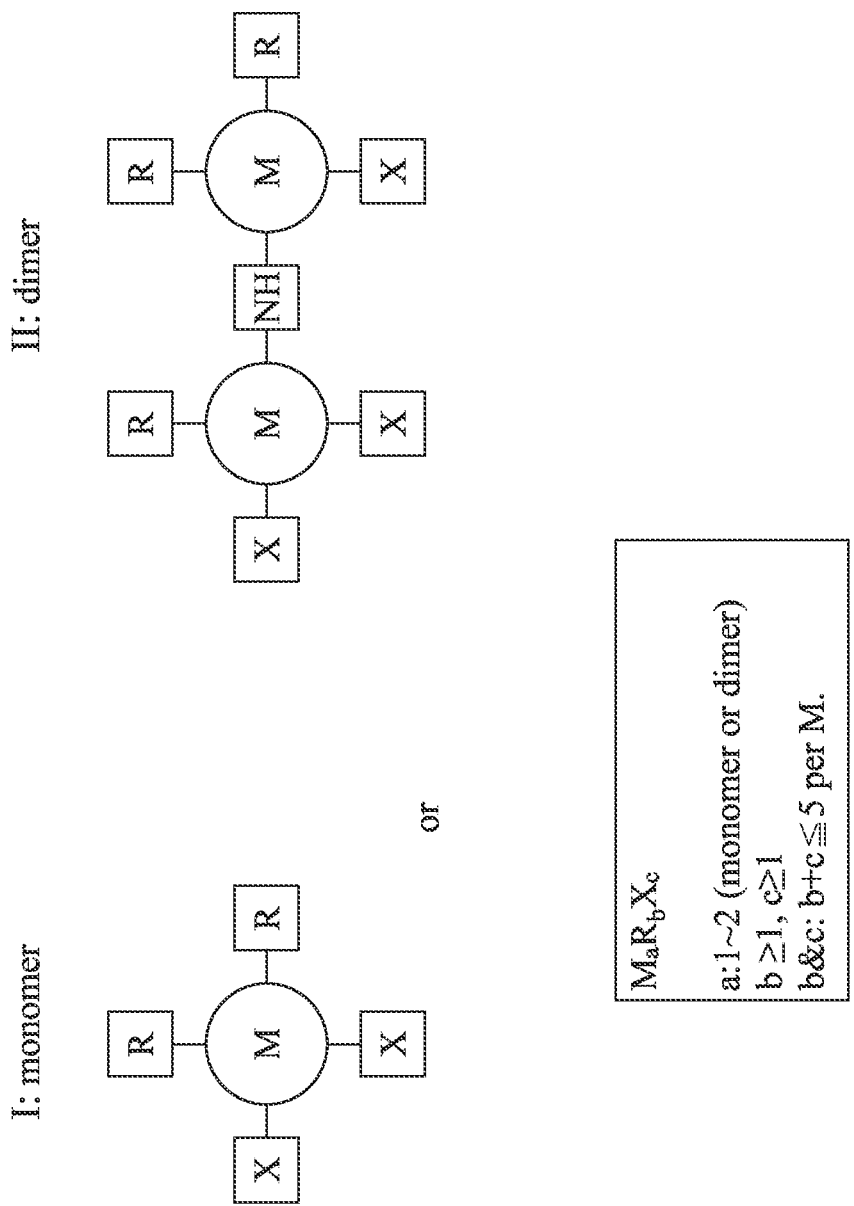

In some embodiments, the photoresist layer 15 is made of a photoresist composition, including a first compound or a first precursor and a second compound or a second precursor combined in a vapor state. The first precursor or first compound is an organometallic having a formula: $M_aR_bX_c$, as shown in FIG. 9A, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \leq a \leq 2$, $b \geq 1$, $c \geq 1$, and $b+c \leq 5$ in some embodiments. In some embodiments, the alkyl, alkenyl, or carboxylate group is substituted with one or more fluoro groups. In some embodiments, the organometallic precursor is a dimer, as shown in FIG. 9A, where each monomer unit is linked by an amine group. Each monomer has a formula: $M_aR_bX_c$, as defined above.

In some embodiments, R is alkyl, such as $C_nH_{2n+1}$ where $n \geq 3$. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

Figure 9B:
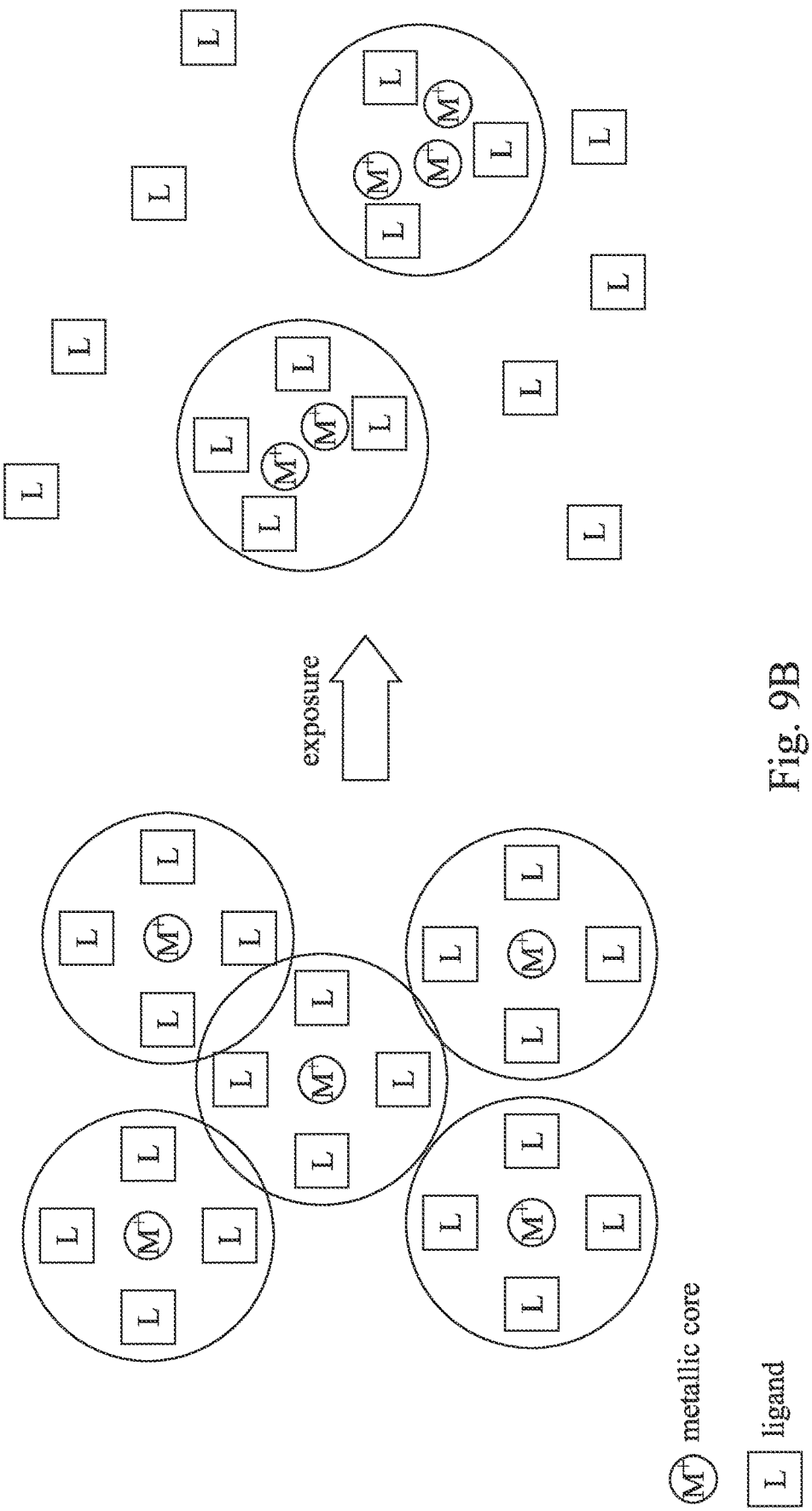

In some embodiments, the first organometallic compound or first organometallic precursor includes a metallic core $M^+$ with ligands L attached to the metallic core $M^+$, as shown in FIG. 9B. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the organometallic precursor or organometallic compound include a sec-hexyl tris(dimethylamino) tin, t-hexyl tris(dimethylamino) tin, i-hexyl tris (dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris (dimethylamino) tin, i-butyl tris(dimethylamino) tin, n-butyl tris(dimethylamino) tin, sec-butyl tris(dimethylamino) tin, i-propyl tris(dimethylamino) tin, n-propyl tris(diethylamino) tin, and analogous alkyl tris(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl tris(dimethylamino) tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_pH_nX_m$, where $0 \leq n \leq 3$, $0 \leq m \leq 3$, $n+m=3$ when p is 1, and $n+m=4$ when p is 2, and each X is independently a halogen selected from the group consisting of F, Cl, Br, and I. In some embodiments, the borane has a formula $B_pH_nX_m$, where $0 \leq n \leq 3$, $0 \leq m \leq 3$, $n+m=3$ when p is 1, and $n+m=4$ when p is 2, and each X is independently a halogen selected from the group consisting of F, Cl, Br, and I. In some embodiments, the phosphine has a formula $P_pH_nX_m$, where $0 \leq n \leq 3$, $0 \leq m \leq 3$, $n+m=3$, when p is 1, or $n+m=4$ when p is 2, and each X is independently a halogen selected from the group consisting of F, Cl, Br, and I.

In some embodiments, the second precursor or compound is water, ammonia, or hydrazine. The reaction product of the water, ammonia, or hydrazine and the organometallic precursor or compound may form hydrogen bonds that increase the boiling point of the reaction product and prevent emission of the metal photoresist material, thereby preventing metal contamination. The hydrogen bonds can also help prevent moisture effects to the photoresist layer quality.

FIG. 9B shows a reaction metallic precursors undergo as a result of exposure to actinic radiation in some embodiments. As a result of exposure to the actinic radiation, ligand groups L are split off from the metallic core $M^+$ of the metallic precursors, and two or more metallic precursor cores bond with each other.

FIG. 9C shows examples of organometallic precursors according to embodiments of the disclosure. In FIG. 9C Bz is a benzene group.

In some embodiments, the operation S110 of depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD).

Figure 10:
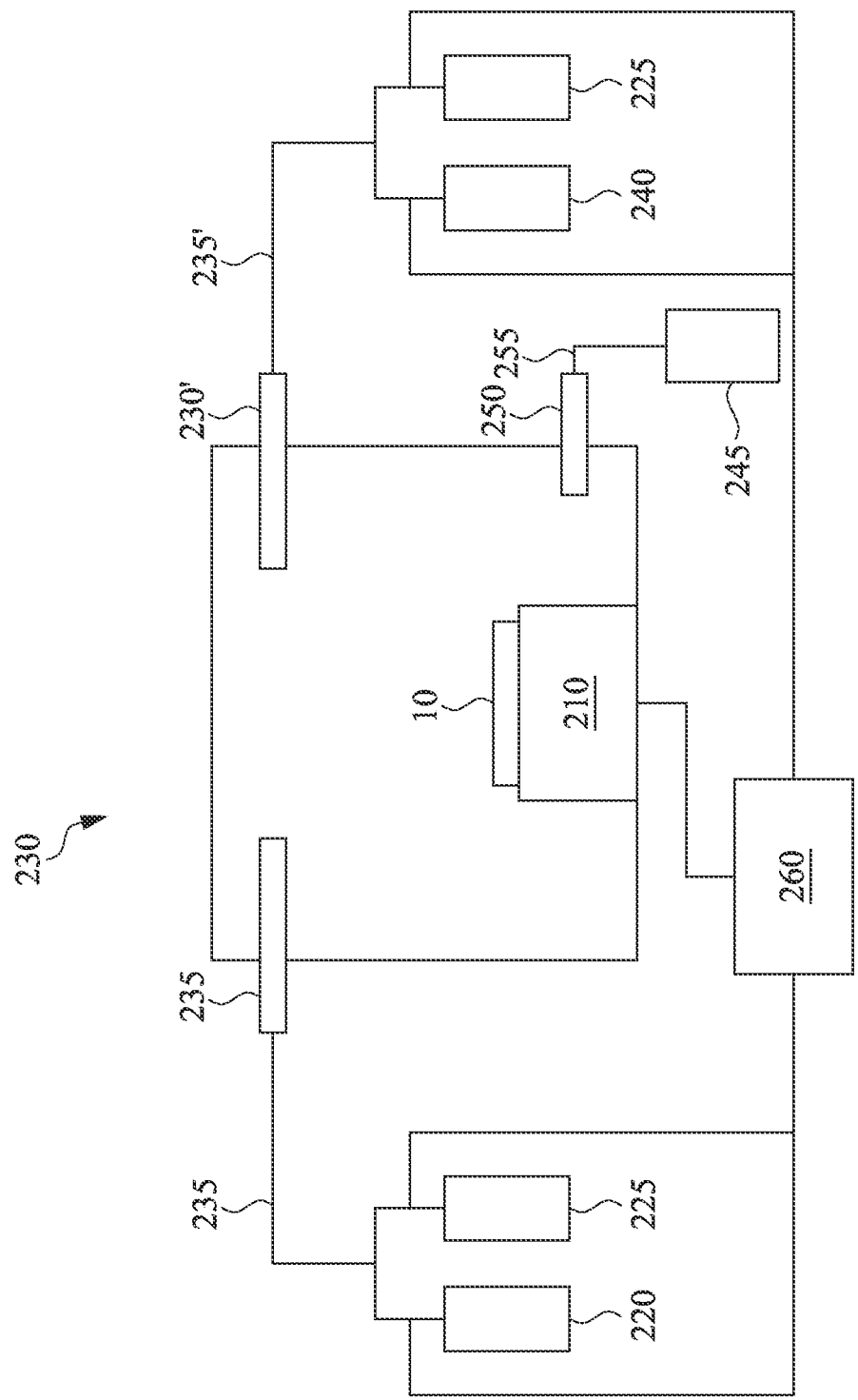
FIG. 10 shows a photoresist deposition apparatus according to some embodiments of the disclosure.

A resist layer deposition apparatus 200 according to some embodiments of the disclosure is shown in FIG. 10. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

Depositing a photoresist layer includes combining the first compound or first precursor and the second compound or second precursor in a vapor state to form the photoresist composition. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

Figure 11:
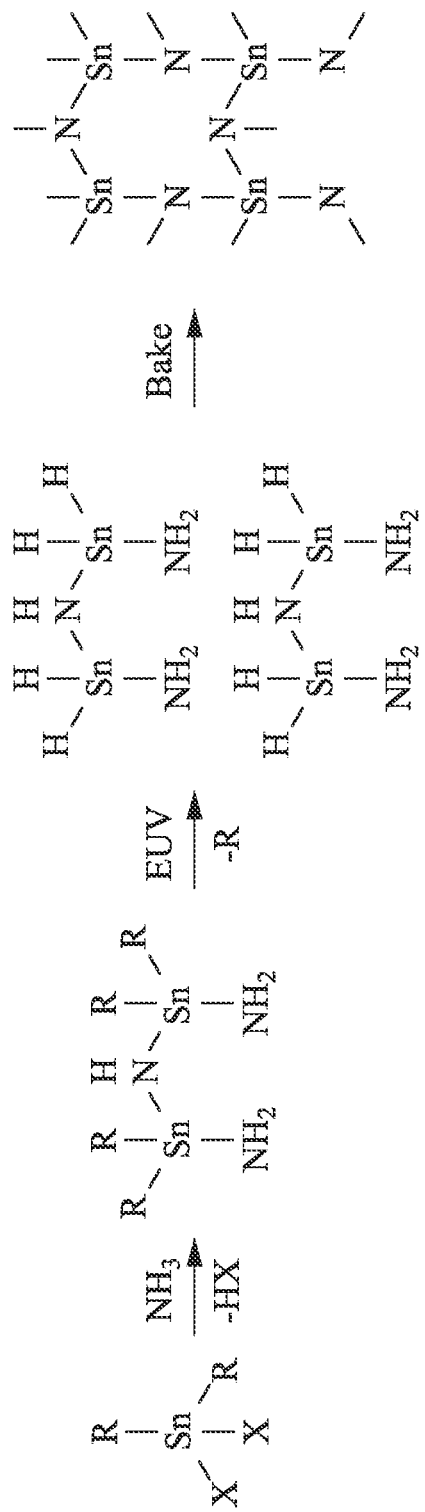
FIG. 11 shows a reaction the photoresist layer undergoes as a result of exposure to actinic radiation and heating according to an embodiment of the disclosure.

FIG. 11 shows a reaction the photoresist composition components undergo as a result of exposure to actinic radiation and heating according to an embodiment of the disclosure. FIG. 11 shows an exemplary chemical structure of the photoresist layer (PR) at various stages of the photoresist patterning method according to embodiments of the disclosure. As shown in FIG. 11, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and prevent the outgassing of metal-containing photoresist material, thereby preventing contamination of the deposition chamber and semiconductor device processing equipment by the metal in the metal-containing photoresist. Moreover, the hydrogen bonds of the amine groups can control the effect moisture has on photoresist layer quality.

In some embodiments, the photoresist composition is an organic polymer-based composition in a solvent deposited by a spin-on coating procedure, followed by a first heating to remove the solvent.

When subsequently exposed to extreme ultraviolet radiation, the organometallic compound absorbs the extreme ultraviolet radiation and one or more organic R groups are cleaved from the organometallic compound to form an amino metallic compound in the radiation exposed areas. Then, when the post-exposure bake (PEB) performed, the amino metallic compounds crosslink through the amine groups in some embodiments, as shown in FIG. 11. In some embodiments, partial crosslinking of the amino metallic compounds occurs as a result of the exposure to extreme ultraviolet radiation.

In some embodiments, the surface treatment operation S115 is an in-situ operation, where the surface treatment is performed in the same processing chamber as the photoresist deposition operation S110. In other embodiments, the surface treatment operation 115 is an ex-situ operation, where the surface treatment is performed in a different processing chamber than the photoresist deposition operation S110. In some embodiments, the surface treatment operation S115 includes changing the surface of the photoresist layer from a hydrophilic surface to a hydrophobic surface. In some embodiments, the surface treatment operation S115 includes replacing end groups of ligands in the photoresist layer with a non-polar organic group. In some embodiments, the non-polar organic groups include alkyl or aryl groups. In some embodiments, the surface treatment includes converting hydrophilic end groups on ligands in the photoresist layer to hydrophobic end groups. In some embodiments, polar or hydrophilic end groups on the ligands, like hydroxyl (—OH) end groups, are replaced by or converted to non-polar or hydrophobic end groups, like methyl groups (—$CH_3$) or phenyl groups (—$C_6H_5$). In some embodiments, the surface treatment includes reacting end groups of ligands in the photoresist layer, such as —OH groups, with ammonia, a silane, a silylamine, an alkyl halide, an aryl halide, a silicon halide, an alkyl amine, an aryl amine, a carboxy alkyl, or a carboxy aryl.

In some embodiments, the —OH end groups on a ligand are reacted with a halosilane ($SiR_yX_{4-y}$), where X is a halogen and R is the ligand. At least one of the halogen reacts with hydrogen and is removed, and the end group is converted to $SiR_yX_{3-y}O$. The ligand R is a non-polar alkyl group, and y is 1-3, in some embodiments. In some embodiments, the reaction temperature is about 20° C. to about 500° C.

Figure 12A:
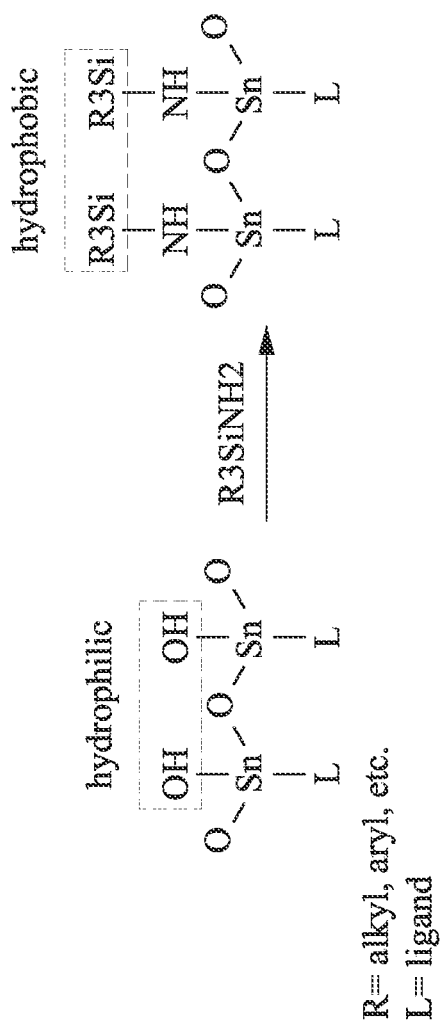
FIG. 12A shows a surface treatment operation according to an embodiment of the disclosure.

FIG. 12A shows a surface treatment operation according to an embodiment of the disclosure. As shown in FIG. 12A, the ligands L in the metallic resist have hydrophilic end groups (—OH groups). A silylamine ($R_3SiNH_2$) is reacted with the hydrophilic end groups, converting the hydrophilic end groups to hydrophobic end groups (silylamino groups)

In some embodiments, the surface treated layer 20a is removed by exposure to ultraviolet radiation, including EUV; thermal treatment; developer solution; or etching. In some embodiments, the surface treated layer 20a is removed by heating the surface treated layer 20a to a temperature ranging from about 50° C. to about 400° C. In some embodiments, the surface treated layer 20a is removed by exposing the surface treated layer 20a to ultraviolet radiation having a wavelength ranging from about 10 nm to about 400 nm.

In other embodiments, the cap layer 20b is a thin layer or includes a plurality of thin layers. In some embodiments, the cap layer 20b is deposited by a chemical vapor deposition (CVD) operation or an atomic layer deposition (ALD) operation (S110). The cap layer 20b may be formed by an in-situ operation or an ex-situ operation. In some embodiments, the cap layer 20b is formed in the same chamber as the CVD or ALD resist layer formation operations, i.e.—an in situ operation. In some embodiments, the cap layer 20b is a dielectric layer. In some embodiments, the cap layer 20b is made of a silicon oxide, a silicon nitride, a silicon carbide, SiOC, SiON, or multilayer combinations thereof. In some embodiments, the silicon oxide, silicon nitride, silicon carbide, SiOC, SiON groups are substituted with one or more polar or non-polar alkyl or aryl groups. In some embodiments, the silicon oxide, silicon nitride, silicon carbide, SiOC, SiON groups are substituted with a tertiary alkyl or tertiary phenyl group. In some embodiments, the substituent is a tert-butyl group.

In some embodiments, the cap layer 20b is a spin-coated layer, such as a hexamethyldisilazane (HMDS), a spin-on glass (SOG), a polymethylmethacrylate (PMMA), or a spin-on carbon (SOC). In such embodiments, the cap layer 20b is formed in a different chamber than the resist layer formation operations (i.e.—an ex-situ operation). In some embodiments, the cap layer 20b does not include photoresist topcoat layers used in immersion lithography processes. In some embodiments, the cap layer 20b does not include organic polymers or HMDS. In some embodiments, the thickness of the cap layer 20b ranges from about 0.5 nm to about 20 nm. Cap layer 20b thicknesses below this range may be insufficient to prevent moisture and oxygen absorption, and photoresist outgassing; and thicknesses above this range may not provide any additional benefit, and may interfere with subsequent processing of the resist. In some embodiments, the cap layer is a monolayer.

Figure 12B:
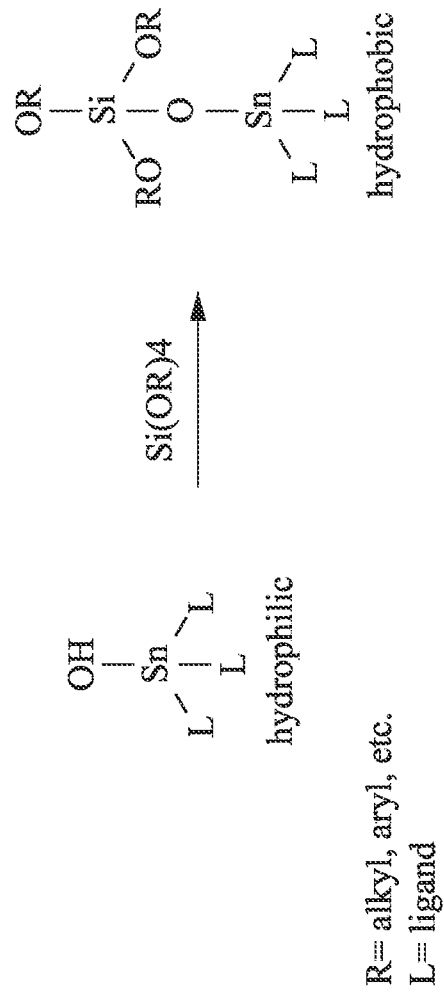
FIG. 12B shows a cap layer formation operation according to an embodiment of the disclosure.

FIG. 12B shows a cap layer formation operation according to an embodiment of the disclosure. As shown in FIG. 12B, the ligands L in the metallic resist have polar, hydrophilic end groups (—OH groups). A silicon oxide substituted with polar or non-polar organic groups, such as, $Si(OR)_4$, is deposited over the resist layer. The cap layer reacts with the polar groups (—OH groups) on the surface of the resist layer to form a non-polar, hydrophobic end group (—OR group) over the resist layer. In some embodiments, R is alkyl or phenyl groups. The non-polar, hydrophobic end groups protect the resist layer 15 from ambient moisture by preventing the penetration of moisture through the cap layer 20b.

In other embodiments, the cap layer 20b is formed by direct deposition of silicon oxide, such as $SiO_2$ over the resist layer by CVD or ALD. The $SiO_2$ thickness ranges from about 3 nm to about 20 nm. The $SiO_2$ cap layer 20b protects the resist layer 15 from directly contacting air.

In some embodiments, the cap layer 20b is removed by exposure to ultraviolet radiation, including EUV; thermal treatment; developer solution; or etching. The cap layer is selected so that it does not negatively affect the absorption of the actinic radiation during the selective exposure of the photoresist layer. In some embodiments, the cap layer 20b is removed by heating the cap layer to a temperature ranging from about 50° C. to about 400° C. In some embodiments, the cap layer 20b is removed by exposing the cap layer 20b to ultraviolet radiation having a wavelength ranging from about 10 nm to about 400 nm.

Figure 13:
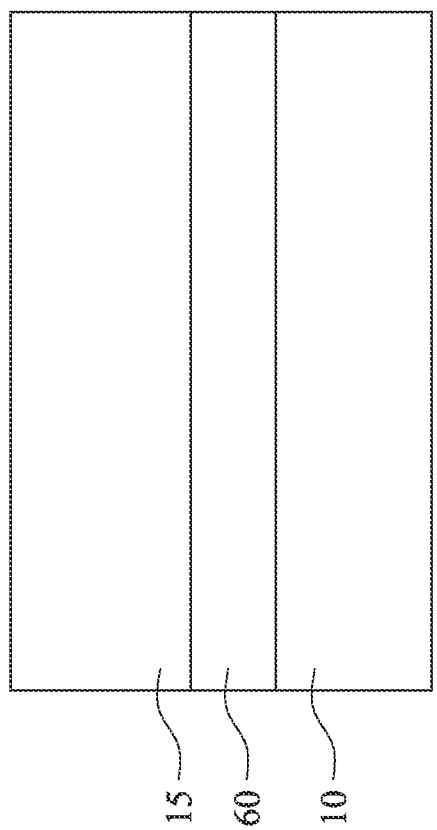
FIG. 13 shows a process stage of a sequential operation according to an embodiment of the disclosure.

In some embodiments, a layer to be patterned 60 is disposed over the substrate prior to forming the photoresist layer, as shown in FIG. 13. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 14A:
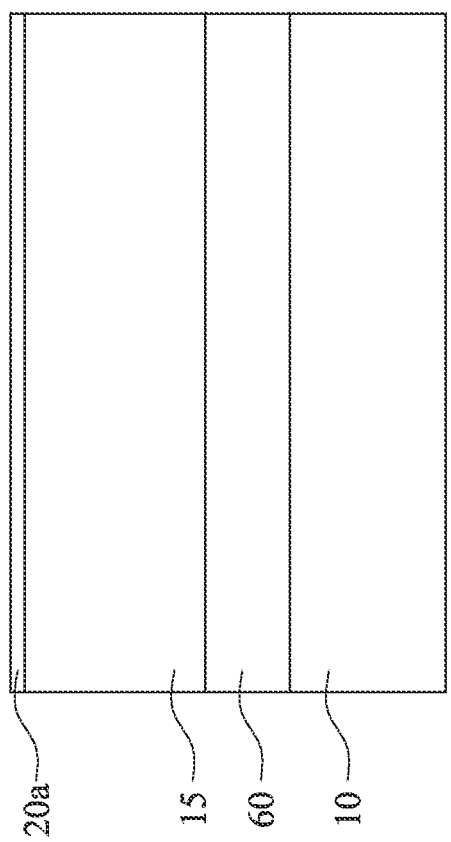
FIGS. 14A and 14B show a process stage of a sequential operation according to embodiments of the disclosure.
Figure 14B:
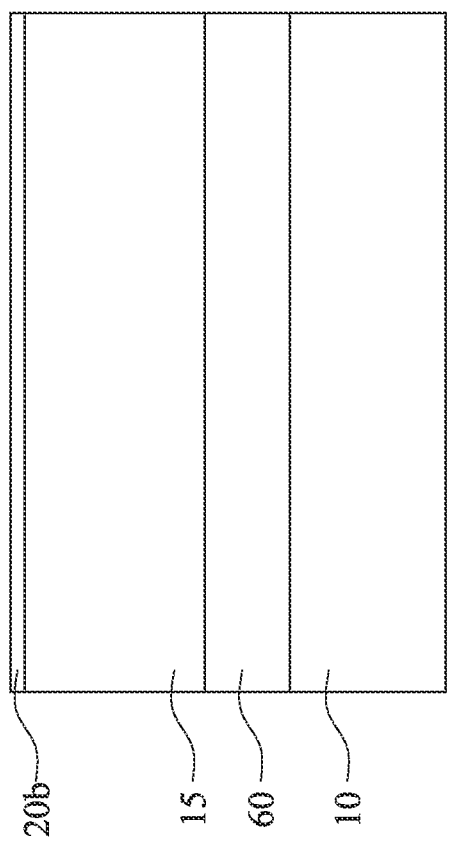

Then the surface of the photoresist layer is treated to form a surface treated layer 20a, as explained in reference to FIG. 4A, or a cap layer 20b is formed over the photoresist layer 15, as shown in FIG. 14A or 14B, respectively.

Figure 15A:
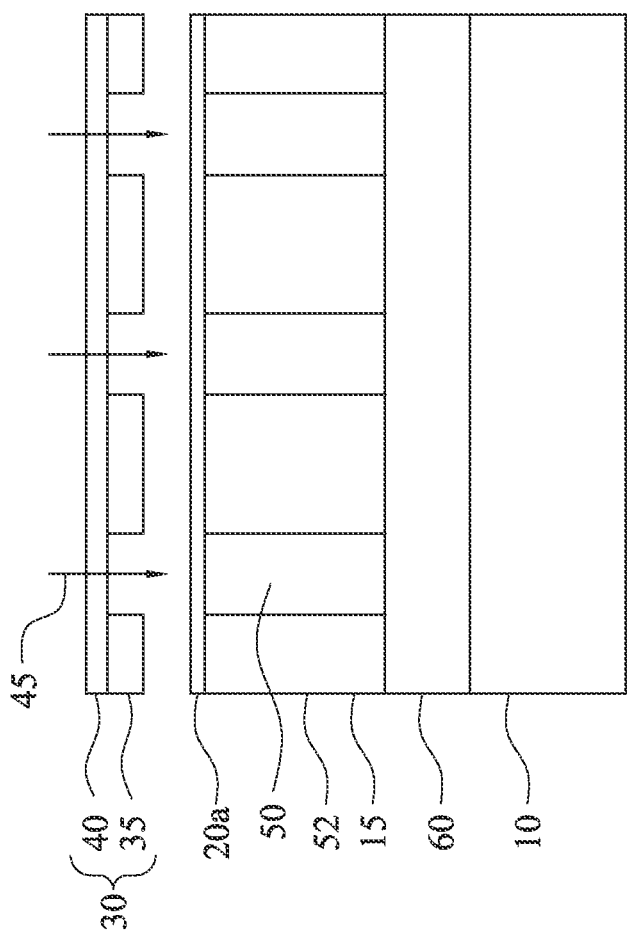
Figure 15B:
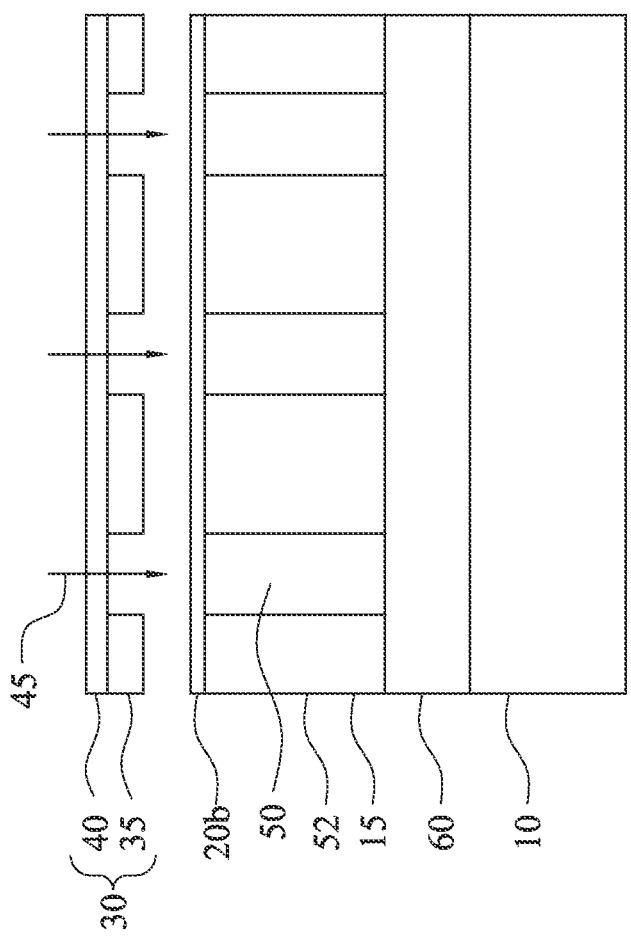
Figure 15C:
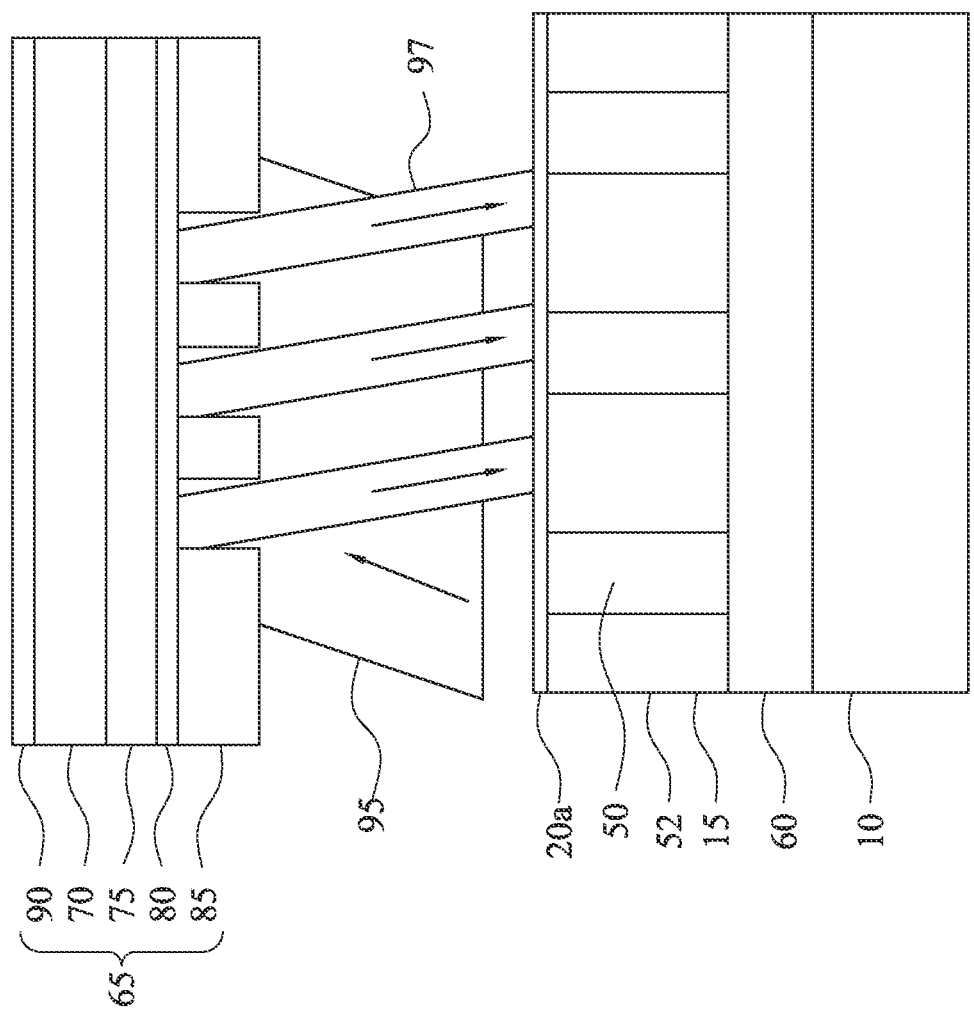
Figure 16F:
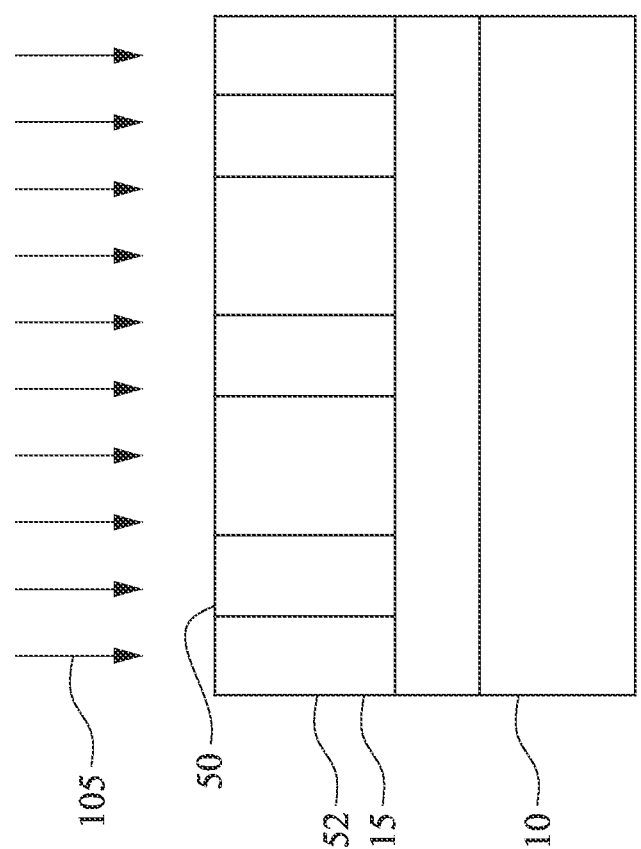

The photoresist layer 15 is subsequently selectively exposed to actinic radiation 45 to form exposed regions 50 and unexposed regions 52 in the photoresist layer, as shown in FIGS. 15A. 15B, 15C, 15D and described herein in relation to FIGS. 5A-5D. As explained herein the photoresist is a negative-tone photoresist in some embodiments.

As shown in FIGS. 16A, 16B, 16C, 16D, 16E, and 16F, the unexposed photoresist regions 52 are developed, as explained herein in reference to FIGS. 6A-6F to form a pattern of photoresist openings 55, as shown in FIG. 17.

Then as shown in FIG. 18, the pattern 55 in the photoresist layer 15 is transferred to the layer to be patterned 60 using an etching operation and the photoresist layer is removed, as explained with reference to FIG. 7 to form pattern 55" in the layer to be patterned 60.

The novel photoresist layer surface treatment or cap layer formation and photolithographic patterning methods according to the present disclosure provide higher semiconductor device feature resolution and density at higher wafer exposure throughput with reduced defects in a higher efficiency process than conventional exposure techniques. Embodiments of the disclosure provide stable photoresist coated substrates that have increased Q-time (the amount of time a photoresist can remain on a substrate or layer to be patterned before the photoresist is exposed to actinic radiation to form a latent pattern). Embodiments of the disclosure prevent moisture and oxygen absorption of the resist layer, and prevent outgassing of the resist layer during subsequent processing. Embodiments of the disclosure prevent contamination of processing chambers, handling tools, and other wafers by metallic resist residues. Embodiments of the present disclosure provide photoresist films of improved stability.

An embodiment of the disclosure is a method of forming a pattern in a photoresist layer, including forming a photoresist layer over a substrate, and reducing moisture or oxygen absorption characteristics of the photoresist layer. The photoresist layer is selectively exposed to actinic radiation to form a latent pattern, and the latent pattern is developed by applying a developer to the selectively exposed photoresist layer to form a pattern. In an embodiment, the photoresist layer includes a metal-containing photoresist composition. In an embodiment, the reducing moisture or oxygen absorption characteristics of the photoresist layer comprises forming a cap layer over the photoresist layer, wherein the cap layer is made of a silicon oxide, a silicon nitride, a silicon carbide, SiOC, SiON, or multilayer combinations thereof. In an embodiment, the cap layer is a monolayer. In an embodiment, the cap layer is formed by chemical vapor deposition or atomic layer deposition. In an embodiment, the reducing moisture or oxygen absorption characteristics of the photoresist layer includes performing a surface treatment to a surface of the photoresist layer. In an embodiment, the surface treatment includes reacting end groups of ligands in the photoresist layer with ammonia, a silane, a silylamine, an alkyl halide, an aryl halide, a silicon halide, an alkyl amine, carboxy alkyls, or a carboxy aryl. In an embodiment, the surface treatment includes replacing end groups of ligands in the photoresist layer with a non-polar organic group. In an embodiment, the surface treatment includes changing the surface of the photoresist layer from a hydrophilic surface to a hydrophobic surface. In an embodiment, the surface treatment includes converting hydrophilic end groups on ligands in the photoresist layer to hydrophobic end groups. In an embodiment, the actinic radiation is extreme ultraviolet radiation. In an embodiment, the method includes after selectively exposing the photoresist layer to actinic radiation to form a latent pattern and before developing the latent pattern, post-exposure baking the photoresist layer. In an embodiment, the post-exposure baking is performed at a temperature ranging from 100° C. to 500° C. In an embodiment, the surface treatment comprises treating photoresist with a plasma or thermally treating the surface of the photoresist layer. In an embodiment, a surface treated portion of the photoresist layer is removed by exposure to ultraviolet radiation, exposure to extreme ultraviolet radiation, thermal treatment, developer solution, or etching. In an embodiment, the cap layer is formed by a chemical vapor deposition (CVD) operation or an atomic layer deposition (ALD) operation. In an embodiment, the cap layer is removed by exposure to ultraviolet radiation, exposure to extreme ultraviolet radiation, thermal treatment, developer solution, or etching. In an embodiment, the cap layer is removed during the developing the latent pattern.

Another embodiment of the disclosure is a method of manufacturing a semiconductor device, including forming a photoresist layer over a substrate by combining a first precursor and a second precursor in a vapor state to form a photoresist material, and depositing the photoresist material over the substrate. The moisture or oxygen absorption characteristics of the photoresist layer is reduced. The photoresist layer is selectively exposed to actinic radiation to form a latent pattern in the photoresist layer. The latent pattern is developed by applying a developer to the selectively exposed photoresist layer to form a pattern in the photoresist layer, and the pattern in the photoresist layer is extended into the substrate. In an embodiment, the first precursor is an organometallic having a formula: $M_aR_bX_c$, where M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$; and the second precursor is at least one of an amine, a borane, a phosphine, or water. In an embodiment, the photoresist material is deposited over the substrate by atomic layer deposition (ALD) or chemical vapor deposition (CVD). In an embodiment, the reducing moisture or oxygen absorption characteristics of the photoresist layer includes changing a surface of the photoresist layer from a hydrophilic surface to a hydrophobic surface. In an embodiment, the reducing the moisture or oxygen absorption of the photoresist layer includes forming a cap layer made of a silicon oxide, a silicon nitride, a silicon carbide, SiOC, SiON, or multilayer combinations thereof. In an embodiment, the method includes removing the cap layer or surface-treated portion of the photoresist layer during the developing the latent pattern. In an embodiment, the reducing moisture or oxygen absorption characteristics of the photoresist layer includes reacting end groups of ligands in the photoresist layer with ammonia, a silane, a silylamine, an alkyl halide, an aryl halide, a silicon halide, an alkyl amine, a carboxy alkyl, or a carboxyl aryl. In an embodiment, the reducing moisture or oxygen absorption characteristics of the photoresist layer includes replacing end groups of ligands in the photoresist layer with a non-polar organic group. In an embodiment, the reducing moisture or oxygen absorption characteristics of the photoresist layer includes converting hydrophilic end groups on ligands in the photoresist layer to hydrophobic end groups. In an embodiment, the cap layer is a monolayer.

Another embodiment of the disclosure is a method of manufacturing a semiconductor device, including depositing a photoresist composition including a first organometallic compound and a second compound over a substrate surface via atomic layer deposition (ALD) or chemical vapor deposition (CVD) to form a photoresist layer. Moisture or oxygen absorption characteristics of the photoresist layer are reduced. The photoresist layer is selectively exposed to actinic radiation to form a latent pattern. The latent pattern is developed by applying a developer to the selectively exposed photoresist layer to form a pattern exposing a portion of the substrate surface. A portion of the substrate surface exposed by the developing is removed. In an embodiment, the removing a portion of the substrate surface by the developing includes etching the substrate surface. In an embodiment, the method includes after selectively exposing the photoresist layer to form a latent pattern, heating the photoresist layer at a temperature ranging from 100° C. to 500° C. In an embodiment, the reducing moisture or oxygen absorption characteristics of the photoresist layer includes reacting end groups of ligands in the photoresist layer with ammonia, a silane, an alkyl halide, a silicon halide, an amino alkyls, or carboxyl alkyls. In an embodiment, the reducing the moisture or oxygen absorption of the photoresist layer includes forming a cap layer made of a silicon oxide, a silicon nitride, a silicon carbide, SiOC, SiON, or multilayer combinations thereof. In an embodiment, the reducing moisture or oxygen absorption characteristics of the photoresist layer includes replacing end groups of ligands in the photoresist layer with a non-polar organic group. In an embodiment, the reducing moisture or oxygen absorption characteristics of the photoresist layer includes changing a surface of the photoresist layer from a hydrophilic surface to a hydrophobic surface. In an embodiment, the reducing moisture or oxygen absorption characteristics of the photoresist layer includes converting hydrophilic end groups on ligands in the photoresist layer to hydrophobic end groups. In an embodiment, the cap layer is a monolayer. In an embodiment, the actinic radiation is extreme ultraviolet radiation.

Another embodiment of the disclosure is a method including forming a resist layer over a substrate, and surface treating a surface of the resist layer or forming a cap layer made of a silicon oxide, a silicon nitride, a silicon carbide, SiOC, SiON, or multilayer combinations thereof over the resist layer. The resist layer is patternwise crosslinked, and a portion of the resist layer not crosslinked is removed during the patternwise crosslinking to form a pattern in the resist layer. In an embodiment, the method includes heating the resist layer after the patternwise crosslinking and before the removing a portion of the resist layer not crosslinked. In an embodiment, the resist layer is heated at a temperature ranging from 100° C. to 500° C. during the heating the resist layer. In an embodiment, the removing a portion of the resist layer includes applying a developer to the patternwise crosslinked resist layer. In an embodiment, the removing a portion of the resist layer includes applying a plasma to the patternwise crosslinked resist layer. In an embodiment, a surface-treated portion of the resist layer or the cap layer is removed after the patternwise crosslinking the resist layer and before the removing a portion of the resist layer. In an embodiment, a surface treated portion of the resist layer or the cap layer is removed by exposure to ultraviolet radiation, exposure to extreme ultraviolet radiation, a thermal treatment, a developer solution, or etching. In an embodiment, the resist layer is formed over the substrate by combining a first precursor and a second precursor in a vapor state to form a resist material, wherein the first precursor is an organometallic having a formula: $M_aR_bX_c$, where M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$; and the second precursor is at least one of an amine, a borane, a phosphine, or water. In an embodiment, the resist layer is deposited over the substrate by atomic layer deposition (ALD) or chemical vapor deposition (CVD).

Another embodiment of the disclosure is a method of patterning a resist layer, including depositing a resist layer over a substrate surface by atomic layer deposition (ALD) or chemical vapor deposition (CVD). The resist layer includes a reaction product of an organometallic compound and at least one of an amine, a borane, a phosphine, and water. A surface of the resist layer is surface treated or a cap layer is formed over the resist layer. After treating the surface of the resist layer or forming the cap layer, the resist layer is patternwise crosslinked to form a latent pattern in the resist layer. The latent pattern is developed by applying a developer to the patternwise crosslinked resist layer to form a pattern exposing a portion of the substrate surface. In an embodiment, the method includes a first heating of the resist layer before the patternwise crosslinking. In an embodiment, the surface treating or the forming the cap layer is performed before the first heating. In an embodiment, the surface treating or the forming the cap layer is performed after the first heating. In an embodiment, the method includes a second heating of the resist layer after the patternwise crosslinking. In an embodiment, the second heating of the resist layer is performed at temperature ranging from 100° C. to 500° C. In an embodiment, the method includes removing an exposed portion of the substrate surface after the developing. In an embodiment, the patternwise crosslinking the resist layer includes patternwise exposing the resist layer to extreme ultraviolet radiation.

Another embodiment of the disclosure is a method of manufacturing a semiconductor device, including depositing a reaction product of a vapor phase organometallic compound and a second vapor phase compound over a substrate to form a resist layer over the substrate. The organometallic compound has a formula: $M_aR_bX_c$, where M is at least one of Sn, Bi, Sb, In, Te, Ti, Zr, Hf, V, Co, Mo, W, Al, Ga, Si, Ge, P, As, Y, La, Ce, or Lu; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$; and the second vapor phase compound is at least one of an amine, a borane, a phosphine, or water. A surface of the resist layer is surface treated or a cap layer is formed over the resist layer. The resist layer is patternwise crosslinked to form a latent pattern in the resist layer. After patternwise crosslinking the resist layer, a surface treated portion of the resist layer or the cap layer is removed. The latent pattern is developed by applying a developer to the patternwise crosslinked resist layer to form a pattern exposing a surface portion of the substrate. In an embodiment, the surface treated portion of the resist layer or the cap layer is removed during the developing the latent pattern. In an embodiment, the patternwise crosslinking the resist layer includes patternwise exposing the resist layer to extreme ultraviolet radiation through a surface treated portion of the resist layer or the cap layer, and heating the patternwise exposed resist layer. In an embodiment, the patternwise exposed resist layer is heated at a temperature ranging from 100° C. to 500° C. In an embodiment, the cap layer is formed, and the cap layer is not a photosensitive layer. In an embodiment, the method includes removing a portion of the substrate exposed by the developing. In an embodiment, the method includes heating the resist layer at temperature ranging from 40° C. to 150° C. before patternwise crosslinking the resist layer. In an embodiment, the surface treating includes reacting end groups of ligands in the resist layer with ammonia, a silane, a silylamine, an alkyl halide, an aryl halide, a silicon halide, an alkyl amine, a carboxy alkyl, or a carboxy aryl. In an embodiment, the surface treating includes replacing end groups of ligands in the resist layer with a non-polar organic group. In an embodiment, the surface treating includes changing the surface of the resist layer from a hydrophilic surface to a hydrophobic surface. In an embodiment, the surface treating includes converting hydrophilic end groups on ligands in the resist layer to hydrophobic end groups. In an embodiment, the cap layer is a monolayer. In an embodiment, the cap layer is made of a silicon oxide, a silicon nitride, a silicon carbide, SiOC, SiON, or multilayer combinations thereof.

Another embodiment of the disclosure is a method of patterning a photoresist layer, including depositing a photoresist layer over a substrate by a vapor phase deposition operation. The photoresist layer includes a reaction product of an organometallic compound and a second compound, wherein the second compound is at least one of an amine, a borane, a phosphine, or water. A cap layer is formed over the photoresist layer, wherein the cap layer is made of a silicon oxide, a silicon nitride, a silicon carbide, SiOC, SiON, or multilayer combinations thereof. The photoresist layer is selectively exposed to actinic radiation through the cap layer to form a latent pattern in the photoresist layer. The cap layer is removed, and portions of the photoresist layer not exposed to the actinic radiation is removed to form a pattern of remaining portions of the photoresist layer that were exposed to the actinic radiation during the selectively exposing the photoresist layer. In an embodiment, the method includes removing portions of the substrate exposed by the removing portions of the photoresist layer. In an embodiment, the removing portions of the substrate includes dry etching the substrate. In an embodiment, the removing the portions of the photoresist layer includes applying a plasma to the photoresist layer. In an embodiment, the vapor phase deposition operation includes atomic layer deposition or chemical vapor deposition. In an embodiment, the cap layer is formed by atomic layer deposition or chemical vapor deposition. In an embodiment, the method includes heating the photoresist layer at temperature ranging from 40° C. to 150° C. before selectively exposing the photoresist layer to actinic radiation. In an embodiment, the cap layer is formed before the heating the photoresist layer at a temperature ranging from 40° C. to 150° C. In an embodiment, the cap layer is formed after heating the photoresist layer at a temperature ranging from 40° C. to 150° C. In an embodiment, the cap layer is removed during the removing portions of the photoresist layer not exposed to the actinic radiation. In an embodiment, the method includes heating the cap layer and the photoresist layer at a temperature ranging from 100° C. to 500° C. after selectively exposing the photoresist layer to actinic radiation.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pattern in a photoresist layer, comprising:
    forming a photoresist layer over a substrate,
       wherein the photoresist layer comprises a metal-containing photoresist composition;
    reducing moisture or oxygen absorption characteristics of the photoresist layer,
       wherein the reducing moisture or oxygen absorption characteristics of the photoresist layer comprises forming a cap layer over the photoresist layer,
       wherein the cap layer is made of a silicon oxide, a silicon nitride, a silicon carbide, SiOC, SiON, or multilayer combinations thereof, and
       wherein the cap layer is a monolayer;
    selectively exposing the photoresist layer to actinic radiation to form a latent pattern; and
    developing the latent pattern by applying a developer to the selectively exposed photoresist layer to form a pattern.

2. The method according to claim 1, wherein the cap layer is formed by chemical vapor deposition (CVD) or atomic layer deposition (ALD).

3. The method according to claim 1, wherein the photoresist layer is formed over the substrate by atomic layer deposition (ALD) or chemical vapor deposition (CVD).

4. The method according to claim 1, further comprising after selectively exposing the photoresist layer to form a latent pattern, heating the photoresist layer at a temperature ranging from 100° C. to 500° C.

5. The method according to claim 1, further comprising heating the cap layer and photoresist layer at a temperature of between 40° C. and 150° C. before selectively exposing the photoresist layer to actinic radiation to form a latent pattern.

6. The method according to claim 1, further comprising heating the photoresist layer at a temperature of between 40° C. and 150° C. before forming the cap layer over the photoresist layer.

7. The method according to claim 1, wherein the cap layer is formed in a same chamber as the photoresist layer.

8. A method of manufacturing a semiconductor device, comprising:
   forming a photoresist layer over a substrate, comprising:
      combining a first precursor and a second precursor in a vapor state to form a photoresist material, and
      depositing the photoresist material over the substrate;
   reducing moisture or oxygen absorption characteristics of the photoresist layer,
   wherein the reducing the moisture or oxygen absorption of the photoresist layer comprises forming a cap layer made of a silicon oxide, a silicon nitride, a silicon carbide, SiOC, SiON, or multilayer combinations thereof, and
   wherein the cap layer is a monolayer;
   selectively exposing the photoresist layer to actinic radiation to form a latent pattern in the photoresist layer;
   developing the latent pattern by applying a developer to the selectively exposed photoresist layer to form a pattern in the photoresist layer; and
   extending the pattern in the photoresist layer into the substrate.

9. The method according to claim 8, wherein the first precursor is an organometallic having a formula:
   $M_a R_b X_c$
   where M is at least one of Sn, Bi, Sb, In, Te, Ti, Zr, Hf, V, Co, Mo, W, Al, Ga, Si, Ge, P, As, Y, La, Ce, or Lu,
   R is a substituted or unsubstituted alkyl, alkenyl, or carboxylate group,
   X is a halide or sulfonate group, and
   $1 \leq a \leq 2, b \geq 1, c \geq 1$, and $b+c \leq 5$; and
   the second precursor is at least one of an amine, a borane, a phosphine, or water.

10. The method according to claim 8, wherein the photoresist material is deposited over the substrate by atomic layer deposition (ALD) or chemical vapor deposition (CVD).

11. The method according to claim 8, wherein the cap layer is formed by chemical vapor deposition (CVD) or atomic layer deposition (ALD).

12. The method according to claim 8, wherein the cap layer is formed in a same chamber as the photoresist layer.

13. The method according to claim 8, further comprising after selectively exposing the photoresist layer to form a latent pattern, heating the photoresist layer at a temperature ranging from 100° C. to 500° C.

14. The method according to claim 8, further comprising heating the cap layer and photoresist layer at a temperature of between 40° C. and 150° C. before selectively exposing the photoresist layer to actinic radiation to form a latent pattern.

15. A method of manufacturing a semiconductor device, comprising:
   depositing a photoresist composition comprising a first organometallic compound and a second compound over a substrate surface via atomic layer deposition (ALD) or chemical vapor deposition (CVD) to form a photoresist layer;
   reducing moisture or oxygen absorption characteristics of the photoresist layer,
   wherein the reducing the moisture or oxygen absorption of the photoresist layer comprises forming a cap layer made of a silicon oxide, a silicon nitride, a silicon carbide, SiOC, SiON, or multilayer combinations thereof, and
   wherein the cap layer is a monolayer;
   selectively exposing the photoresist layer to actinic radiation to form a latent pattern;
   developing the latent pattern by applying a developer to the selectively exposed photoresist layer to form a pattern exposing a portion of the substrate surface; and
   removing a portion of the substrate surface exposed by the developing.

16. The method according to claim 15, wherein the removing a portion of the substrate surface by the developing includes etching the substrate surface.

17. The method according to claim 15, further comprising after selectively exposing the photoresist layer to form a latent pattern, heating the photoresist layer at a temperature ranging from 100° C. to 500° C.

18. The method according to claim 15, wherein the cap layer is formed in a same chamber as the photoresist layer.

19. The method according to claim 15, further comprising heating the cap layer and photoresist layer at a temperature of between 40° C. and 150° C. before selectively exposing the photoresist layer to actinic radiation to form a latent pattern.

20. The method according to claim 15, further comprising heating the photoresist layer at a temperature of between 40° C. and 150° C. before forming the cap layer over the photoresist layer.

* * * * *